United States Patent
Chen et al.

(10) Patent No.: US 12,266,576 B2
(45) Date of Patent: Apr. 1, 2025

(54) SEMICONDUCTOR DEVICE AND METHODS OF MANUFACTURE

(71) Applicant: Taiwan Semiconductor Manufacturing Co., Ltd., Hsinchu (TW)

(72) Inventors: Yen-Ting Chen, Taichung (TW); Wei-Yang Lee, Taipei (TW); Feng-Cheng Yang, Zhudong Township (TW); Yen-Ming Chen, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/813,086

(22) Filed: Jul. 18, 2022

(65) Prior Publication Data

US 2022/0352038 A1   Nov. 3, 2022

Related U.S. Application Data

(62) Division of application No. 16/723,218, filed on Dec. 20, 2019, now Pat. No. 11,728,223.

(51) Int. Cl.
*H01L 21/768* (2006.01)
*H01L 21/02* (2006.01)
(Continued)

(52) U.S. Cl.
CPC ............. *H01L 21/823871* (2013.01); *H01L 21/31111* (2013.01); *H01L 21/31116* (2013.01); *H01L 21/76802* (2013.01); *H01L 21/76877* (2013.01); *H01L 21/823821* (2013.01); *H01L 23/528* (2013.01); *H01L 23/53295* (2013.01);
(Continued)

(58) Field of Classification Search
CPC ......... H01L 29/4238; H01L 21/823456; H01L 27/088; H01L 29/0847; H01L 29/7848
See application file for complete search history.

(56) References Cited

U.S. PATENT DOCUMENTS

| 9,105,490 B2 | 8/2015 | Wang et al. |
| 9,236,267 B2 | 1/2016 | De et al. |

(Continued)

FOREIGN PATENT DOCUMENTS

TW   201913938 A   4/2019

*Primary Examiner* — Brian Turner
(74) *Attorney, Agent, or Firm* — Slater Matsil, LLP

(57) ABSTRACT

A semiconductor device and methods of forming the semiconductor device are described herein and are directed towards forming a source/drain contact plug for adjacent finFETs. The source/drain regions of the adjacent finFETs are embedded in an interlayer dielectric and are separated by an isolation region of a cut-metal gate (CMG) structure isolating gate electrodes of the adjacent finFETs The methods include recessing the isolation region, forming a contact plug opening through the interlayer dielectric to expose portions of a contact etch stop layer disposed over the source/drain regions through the contact plug opening, the contact etch stop layer being a different material from the material of the isolation region. Once exposed, the portions of the CESL are removed and a conductive material is formed in the contact plug opening and in contact with the source/drain regions of the adjacent finFETs and in contact with the isolation region.

20 Claims, 27 Drawing Sheets

(51) Int. Cl.
   *H01L 21/311*   (2006.01)
   *H01L 21/762*   (2006.01)
   *H01L 21/8238*  (2006.01)
   *H01L 23/528*   (2006.01)
   *H01L 23/532*   (2006.01)
   *H01L 27/092*   (2006.01)
   *H01L 29/08*    (2006.01)
   *H01L 29/66*    (2006.01)
   *H01L 21/265*       (2006.01)
   *H01L 21/266*       (2006.01)
   *H01L 21/3105*      (2006.01)

(52) U.S. Cl.
   CPC ...... *H01L 27/0924* (2013.01); *H01L 29/0847*
   (2013.01); *H01L 21/02211* (2013.01); *H01L 21/02271* (2013.01); *H01L 21/26513* (2013.01); *H01L 21/266* (2013.01); *H01L 21/31053* (2013.01); *H01L 21/76224* (2013.01); *H01L 21/823814* (2013.01); *H01L 21/823864* (2013.01); *H01L 21/823878* (2013.01); *H01L 29/66545* (2013.01)

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 9,985,023 B1 | 5/2018 | Liu et al. |
| 2009/0140428 A1 | 6/2009 | Bonilla et al. |
| 2014/0273369 A1 | 9/2014 | Wei et al. |
| 2015/0170916 A1 | 6/2015 | Yu et al. |
| 2015/0295089 A1 | 10/2015 | Huang et al. |
| 2016/0268171 A1 | 9/2016 | Wei et al. |
| 2016/0284697 A1* | 9/2016 | Yoon .................... H01L 27/088 |
| 2016/0308004 A1 | 10/2016 | Lee et al. |
| 2016/0359012 A1 | 12/2016 | Yu et al. |
| 2017/0012129 A1 | 1/2017 | Basker et al. |
| 2017/0047325 A1* | 2/2017 | Mehta ................. H01L 29/0847 |
| 2017/0221895 A1 | 8/2017 | Lii |
| 2018/0122800 A1 | 5/2018 | Cheng et al. |
| 2018/0138092 A1 | 5/2018 | Lee et al. |
| 2018/0190504 A1 | 7/2018 | Lee et al. |
| 2018/0190653 A1 | 7/2018 | Lu et al. |
| 2018/0190810 A1 | 7/2018 | Li et al. |
| 2019/0067290 A1 | 2/2019 | Wang et al. |
| 2019/0206867 A1* | 7/2019 | Lee ................. H01L 21/823864 |
| 2019/0304833 A1 | 10/2019 | Chen et al. |
| 2019/0305099 A1 | 10/2019 | Jo et al. |
| 2019/0333820 A1 | 10/2019 | Chang et al. |
| 2019/0355721 A1* | 11/2019 | Jambunathan ........ H01L 29/785 |
| 2019/0363085 A1 | 11/2019 | Oh et al. |

\* cited by examiner

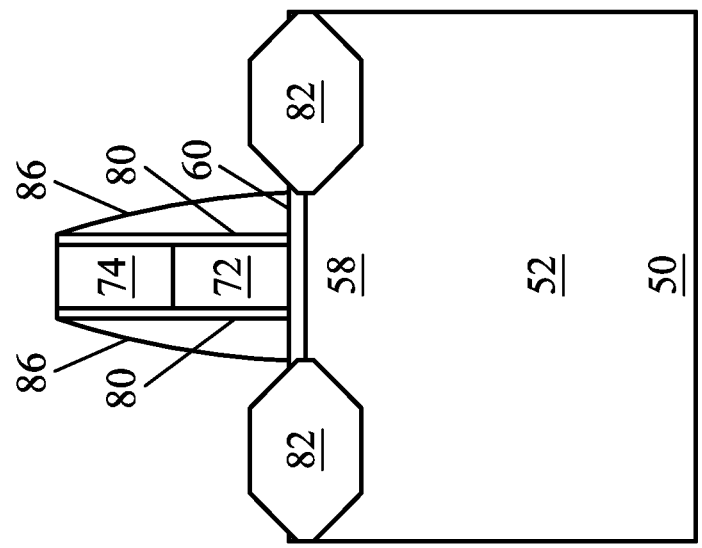
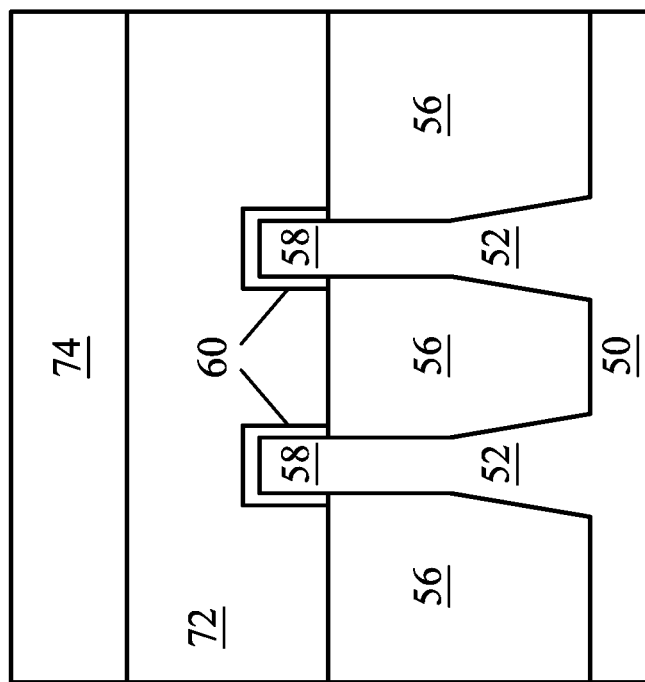
Figure 10B
Figure 10A

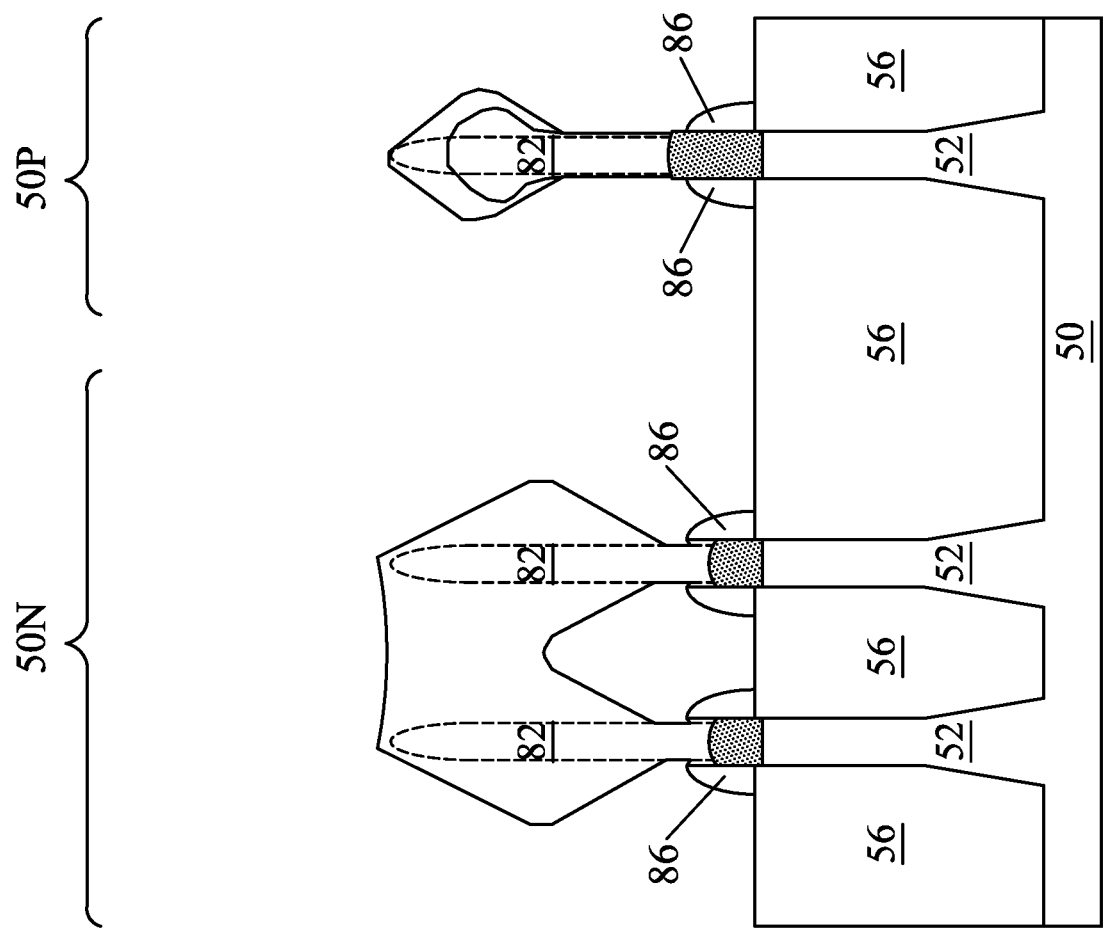

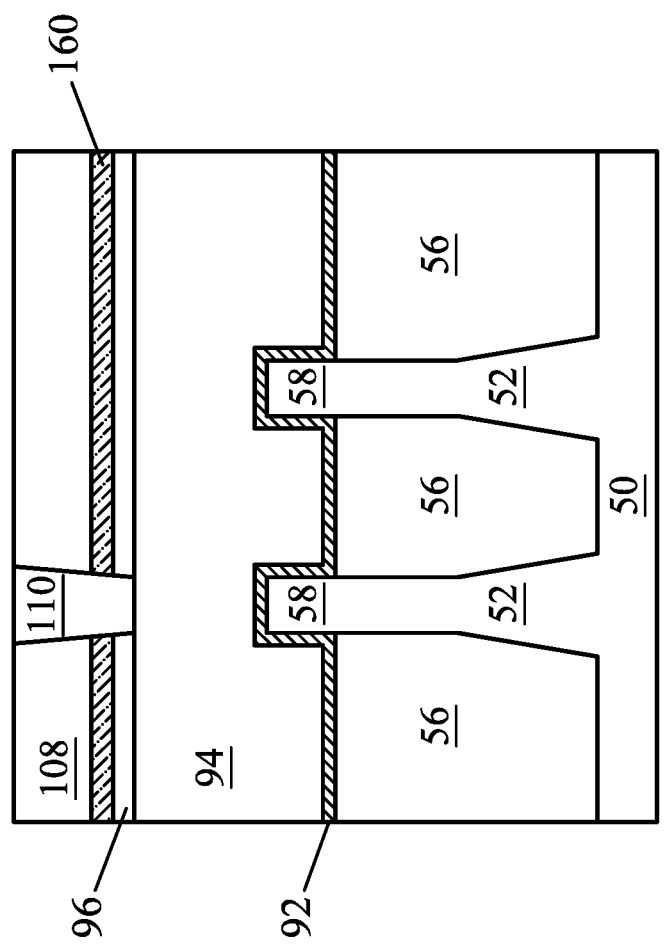
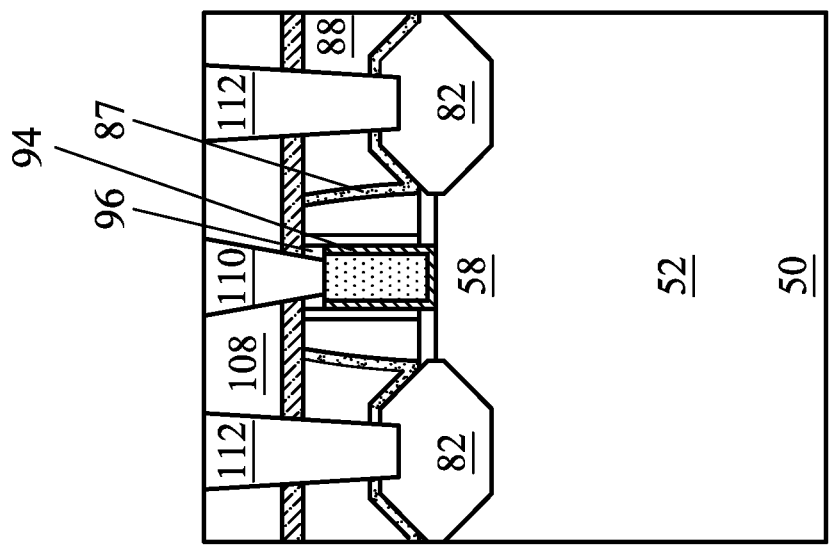
Figure 19A
Figure 19B

SEMICONDUCTOR DEVICE AND METHODS OF MANUFACTURE

PRIORITY CLAIM AND CROSS-REFERENCE

This application is a divisional of U.S. patent application Ser. No. 16/723,218, filed on Dec. 20, 2019, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-19C are cross-sectional views of intermediate stages in the manufacturing of FinFETs, in accordance with some embodiments.

DETAILED DESCRIPTION

Figure 1:
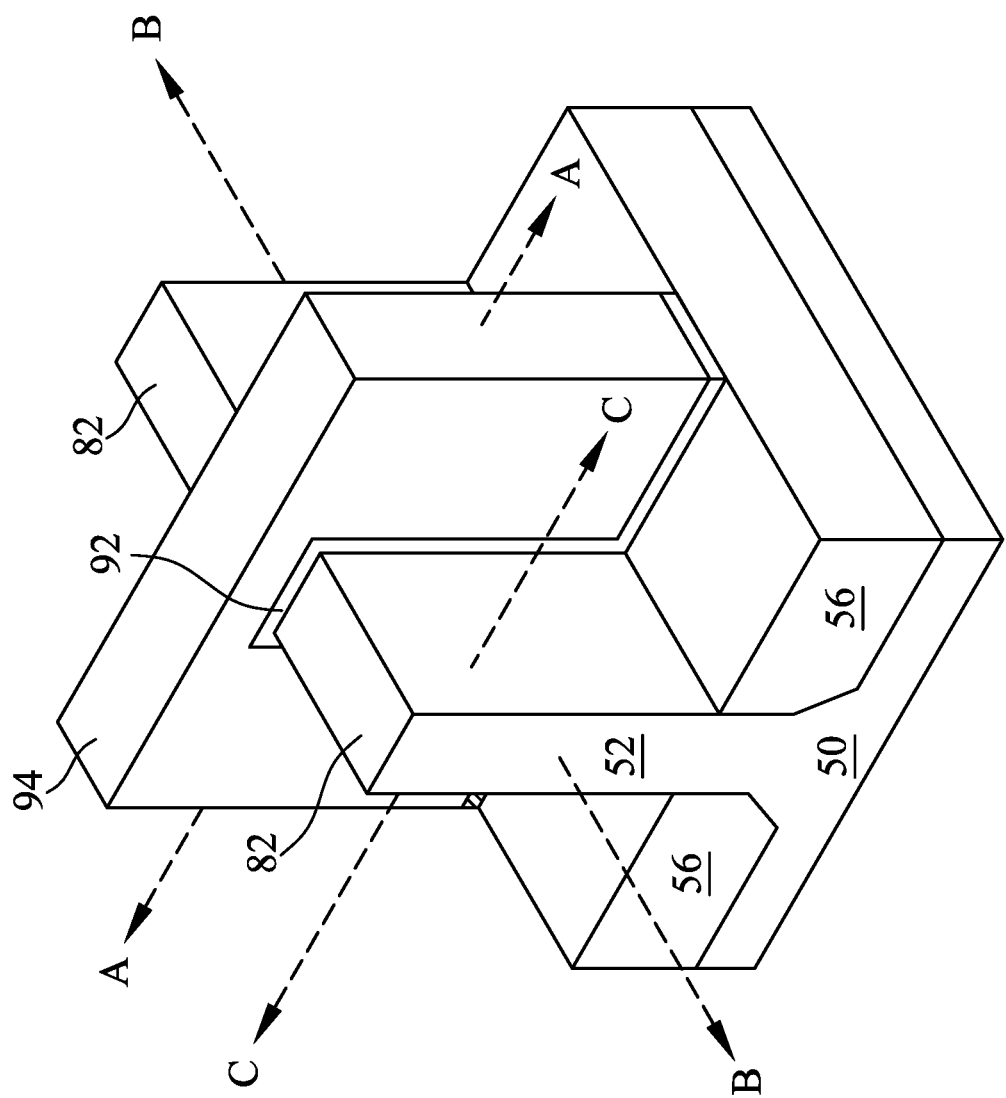
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a FinFET in a three-dimensional view, in accordance with some embodiments. The FinFET comprises a fin 52 on a substrate 50 (e.g., a semiconductor substrate). STI regions 56 are disposed in the substrate 50, and the fin 52 protrudes above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring STI regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 19C are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 15C, 16A, 16C, and 19A are illustrated along reference cross-section A-A illustrated in FIG. 1, and FIGS. 8B, 9B, 10B, 11B, 12B, 13B, 14B, 14C, 15B, 16B, and 19B are illustrated along a similar cross-section B-B illustrated in FIG. 1, except for multiple fins/FinFETs. FIGS. 10C, 11C, 15D, 16D, 17, 18, and 19C are illustrated along reference cross-section C-C illustrated in FIG. 1, except for multiple fins/FinFETs.

Figure 2:
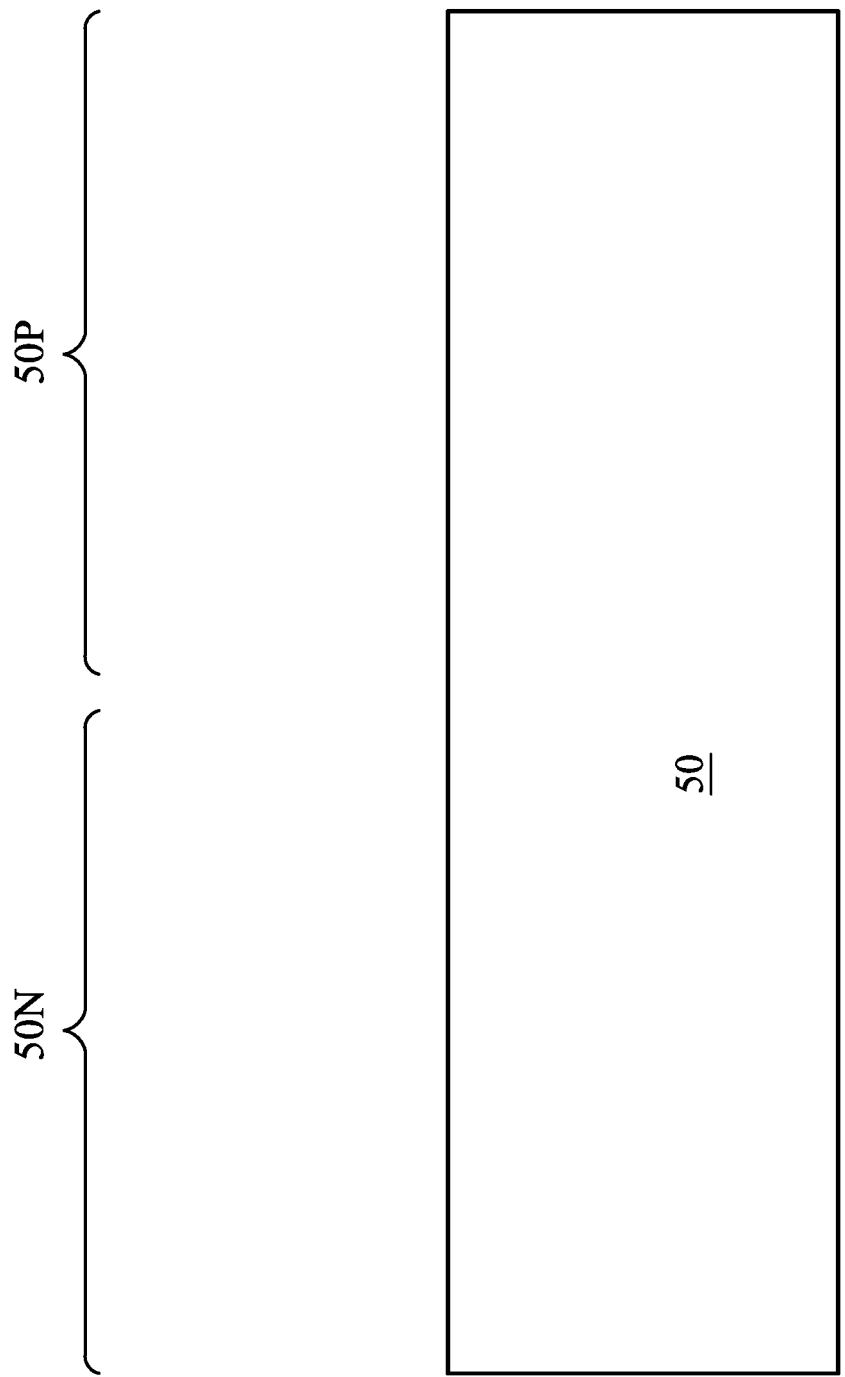

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. However, it is to be understood that the regions 50N and 50P may be used to form any type device (e.g., n-type devices, p-type devices, passive devices, active devices, combinations of these, or the like). Furthermore, the regions 50N and 50P may be adjacent one another or they may be physically separated from one another. Moreover, any number of device features (e.g., other active devices, doped regions, isolation structures, etc.) may be disposed between the region 50N and the region 50P.

Figure 3:
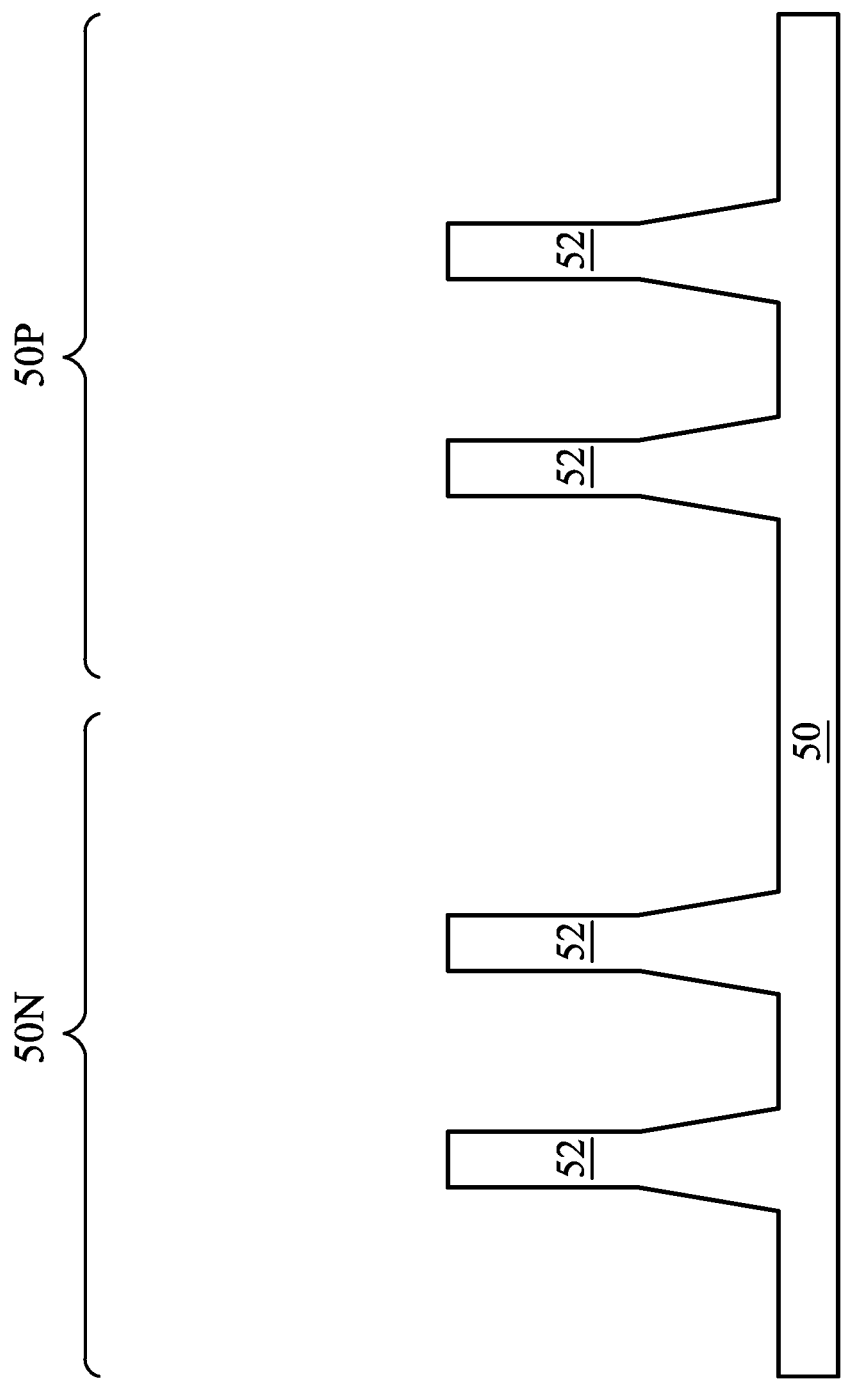

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etching may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52. In some embodiments, the mask (or other layer) may remain on the fins 52.

Figure 4:
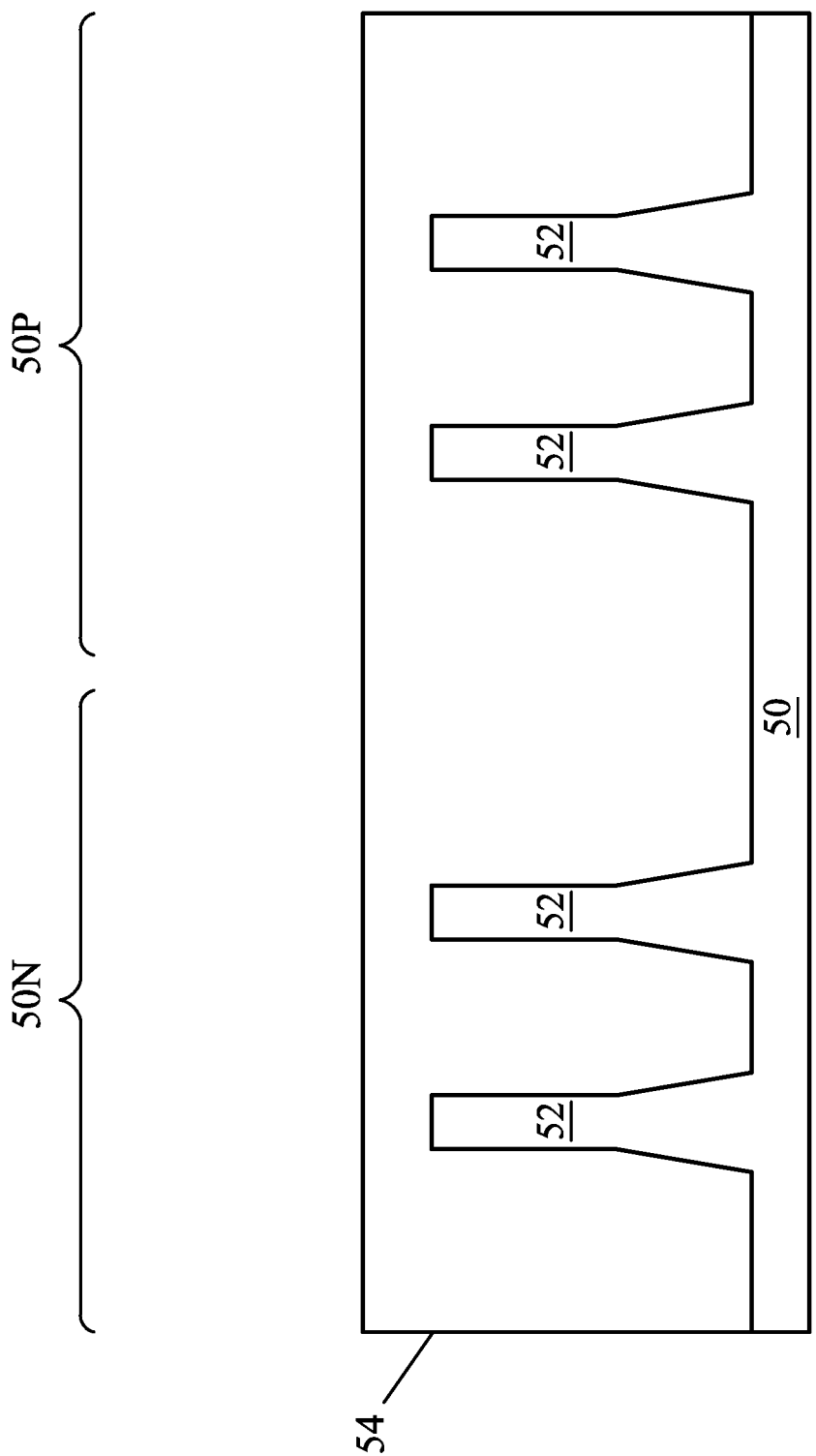

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess material of the insulation material 54 covers the fins 52. Although the insulation material 54 is illustrated as a single layer, some embodiments may utilize multiple layers. For example, in some embodiments an optional liner (not shown) may first be formed along a surface of the substrate 50 and the fins 52. Thereafter, a fill material, such as those discussed above may be formed over the optional liner.

Figure 5:
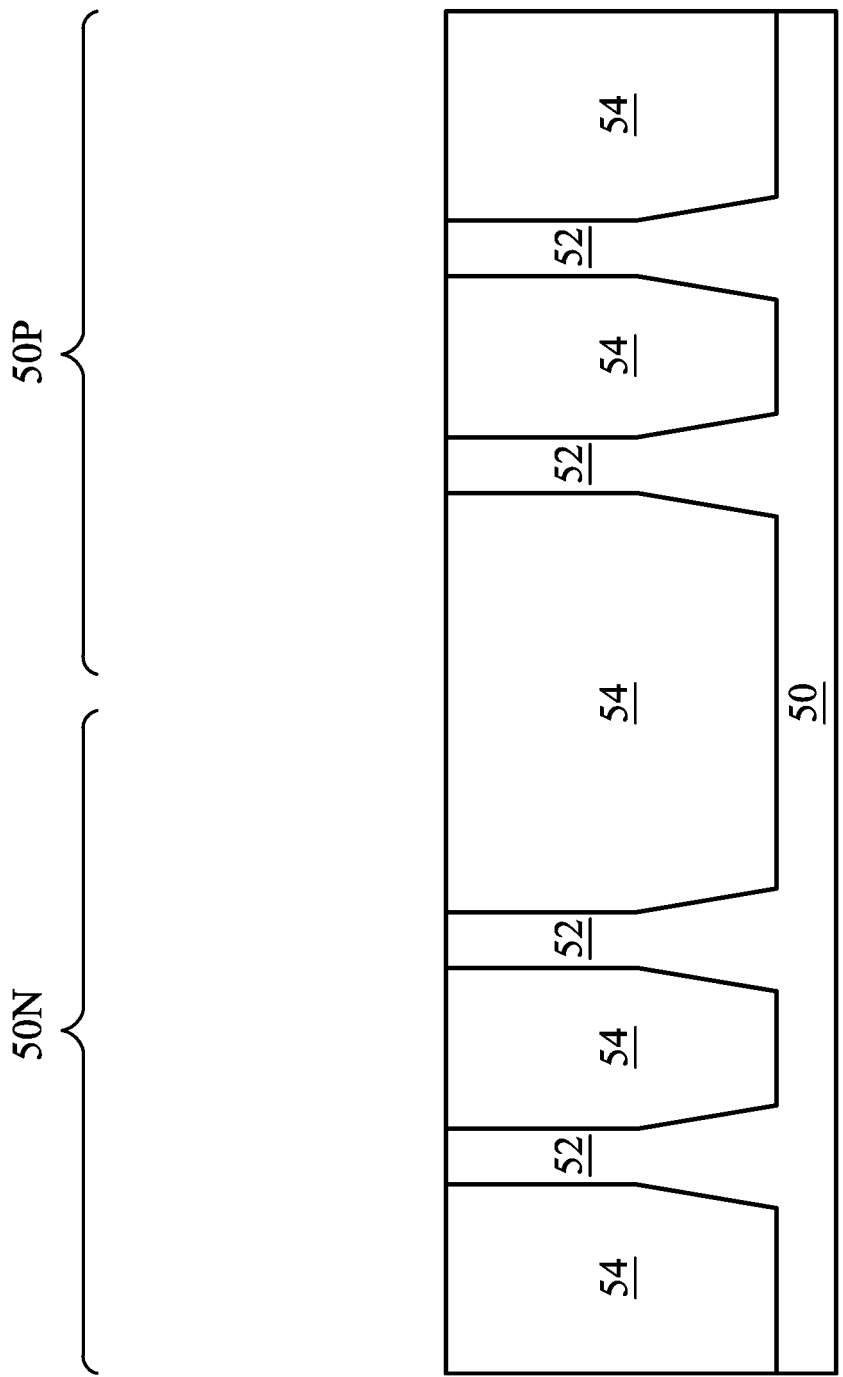

In FIG. 5, a removal process is applied to the insulation material 54 to remove excess material of the insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
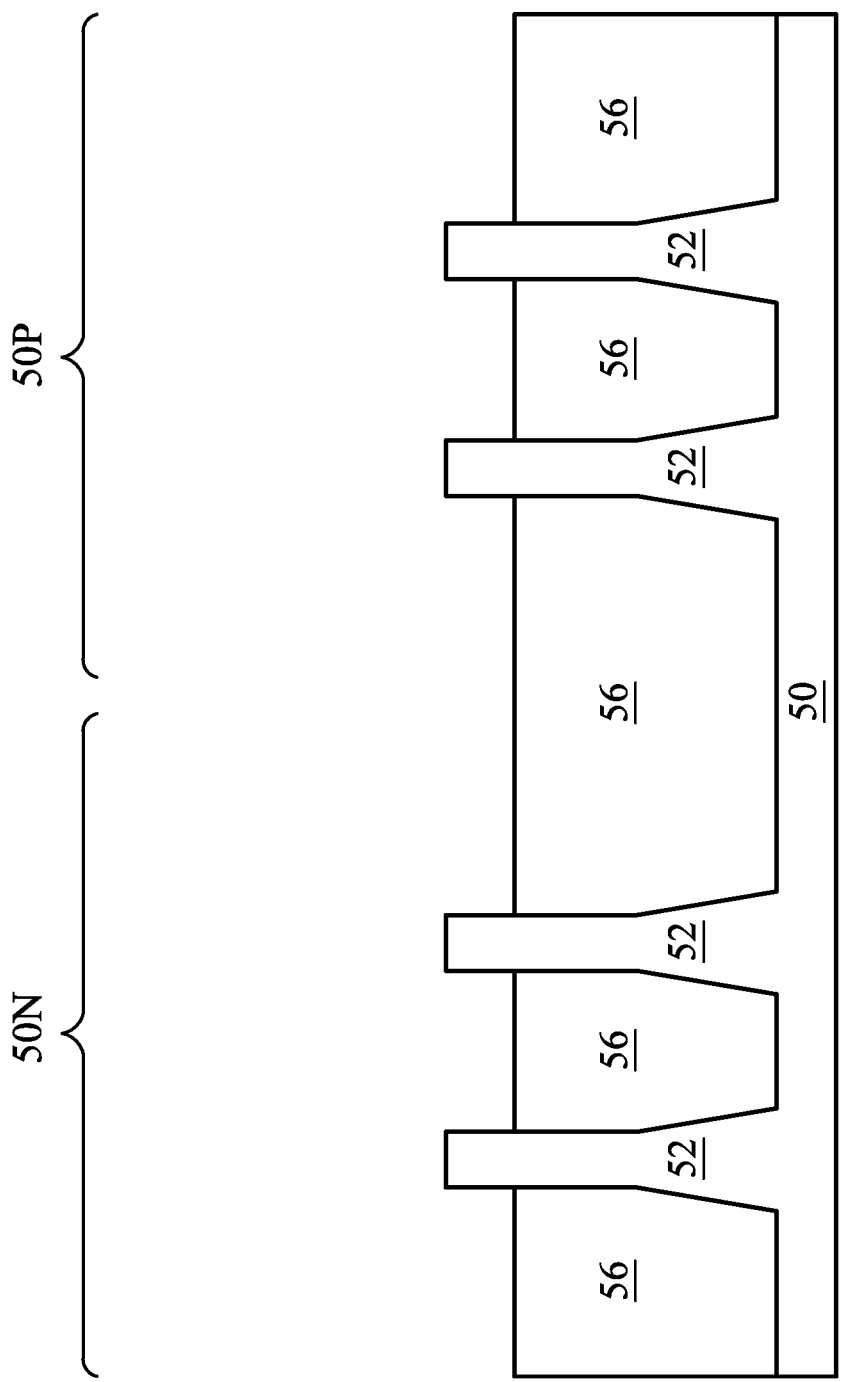

In FIG. 6, the insulation material 54 is recessed to form shallow trench isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface, or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal process may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
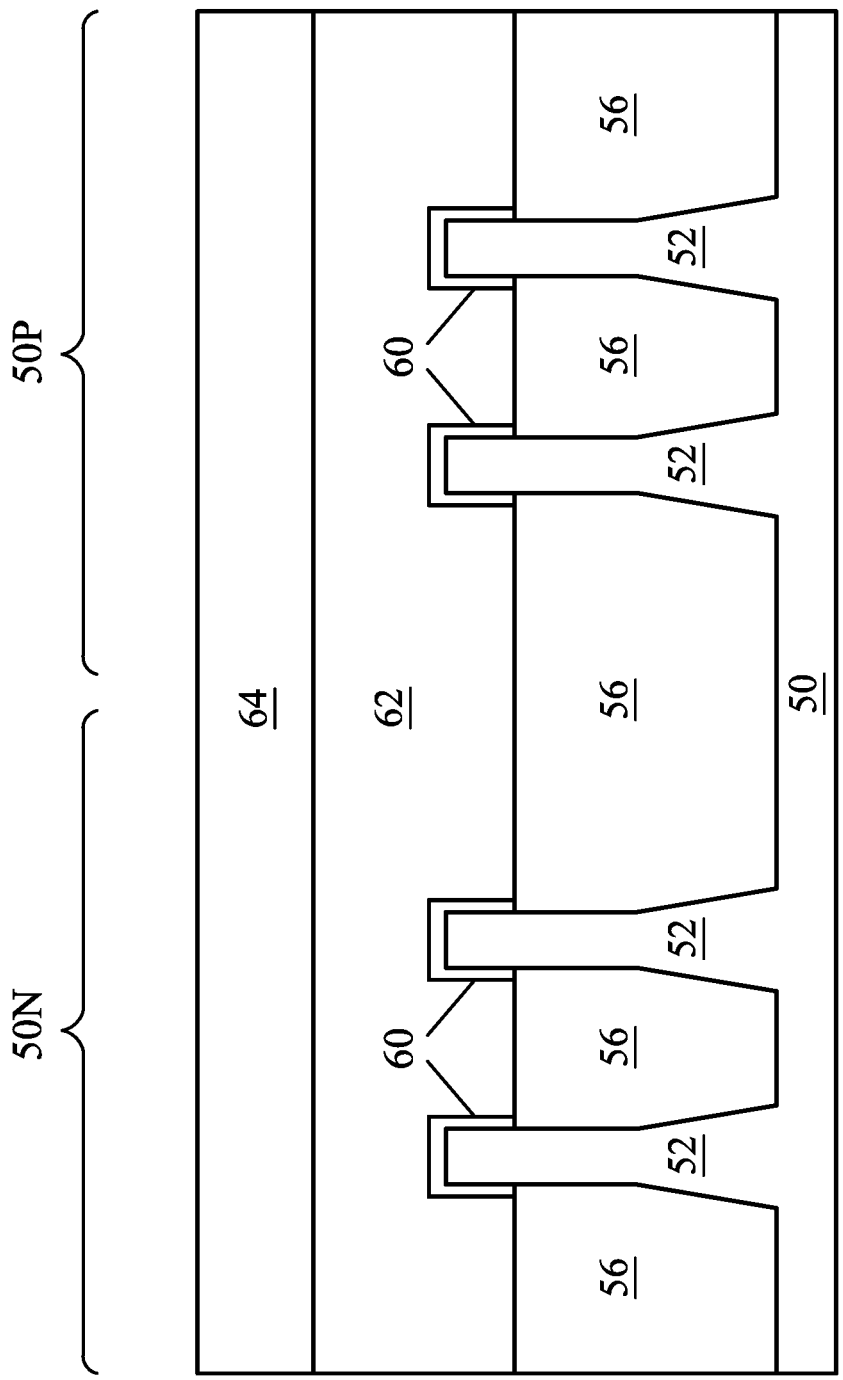

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a dummy gate layer 62 and a mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 19C illustrate various additional steps in the manufacturing of embodiment devices. FIGS. 8A through 19C illustrate features in either of the region 50N and the region 50P. For example, the structures illustrated in FIGS. 8A through 19C may be applicable to both the region 50N and the region 50P. Differences (if any) in the structures of the region 50N and the region 50P are described in the text accompanying each figure.

Figure 8B:
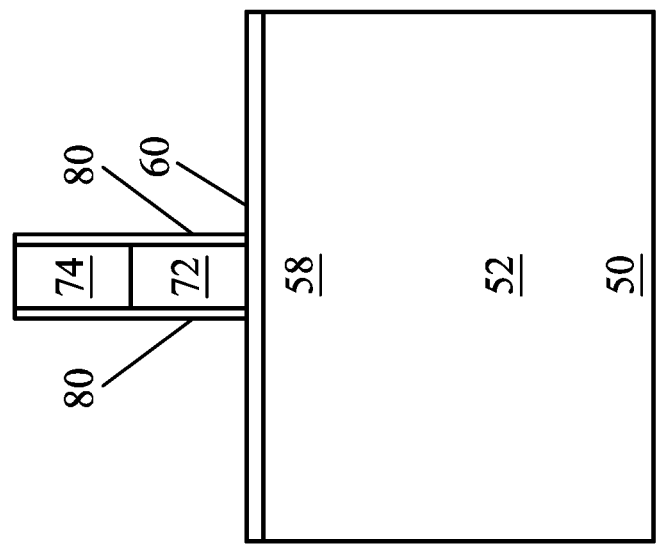
Figure 8A:
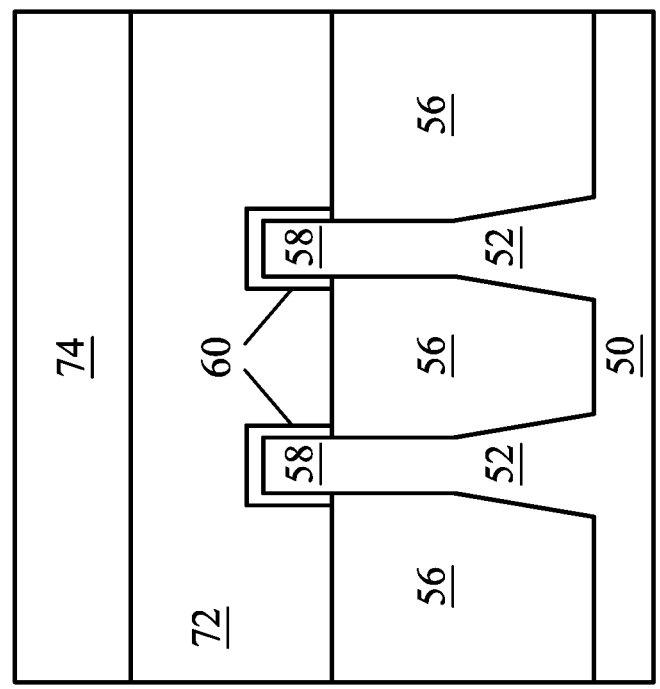

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover the respective channel of the channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of the fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{19}$ $cm^{-3}$. An anneal process may be used to repair implant damage and to activate the implanted impurities.

Figure 9B:
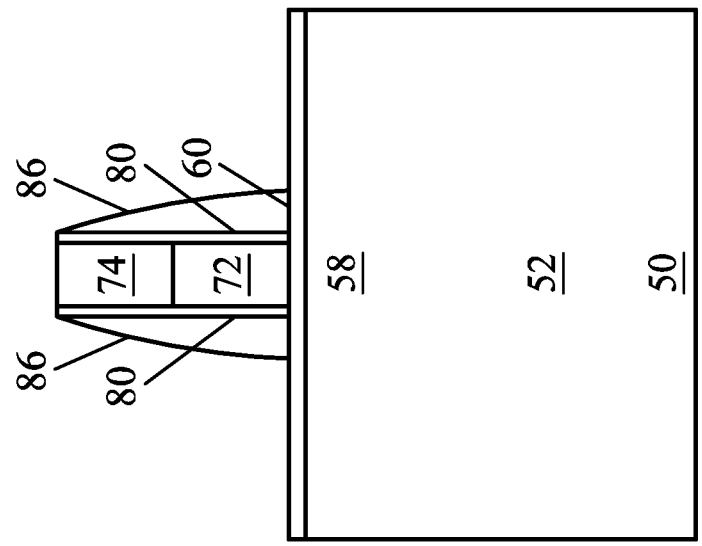
Figure 9A:
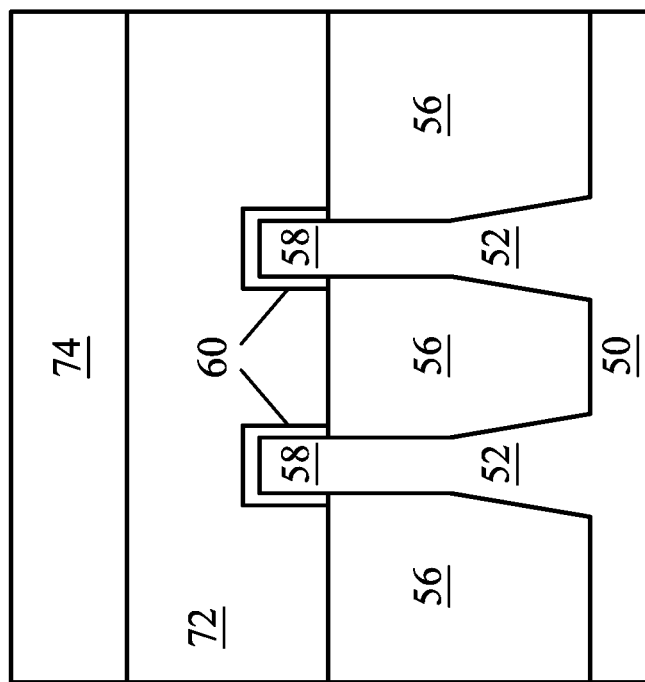

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

In FIGS. 10A and 10B, source/drain regions 82 are formed in the fins 52 to exert stress in the respective channel of the channel regions 58, thereby improving performance. The source/drain regions 82 are formed in the fins 52 such that each dummy gate 72 is disposed between respective neighboring pairs of the source/drain regions 82. In some embodiments the source/drain regions 82 may extend into, and may also penetrate through, the fins 52. In some embodiments, the gate spacers 86 are used to separate the source/drain regions 82 from the dummy gates 72 by an appropriate lateral distance so that the source/drain regions 82 do not short out subsequently formed gates of the resulting FinFETs.

FIG. 10C illustrates, in the cross-section C-C extending through source/drain regions 82, the source/drain regions 82 formed in the fins 52 in the region 50N of an NMOS FinFET device and in the region 50P of an adjacent PMOS FinFET device, according to some embodiments. Although FIG. 10C illustrates the FinFET device of region 50N as an n-type device (e.g., NMOS device) and illustrates the FinFET device of region 50P as a p-type device (e.g., PMOS device), it is to be understood that n-type devices, p-type devices, or any combination of these devices may be formed in either of the region 50N and/or the region 50P and the embodiment illustrated in FIG. 10C merely serves as an example. Furthermore, it is to be understood that the p-type device formed in the region 50P as illustrated in FIG. 10C may be formed using any suitable number of fins 52, although FIG. 10C illustrates only one of the two fins 52 of the region 50P that is illustrated in FIG. 7.

The source/drain regions 82 in the region 50N, e.g., the NMOS region, may be formed by initially masking the region 50P, e.g., the PMOS region. According to some embodiments, an etching mask may be formed from a material such as a photoresist material, a dielectric material, or the like via a spin-on process, a chemical vapor deposition (CVD) (e.g., plasma enhanced chemical vapor deposition (PECVD), low pressure chemical vapor deposition (LPCVD), or the like). However, any suitable materials and any suitable deposition process may be utilized. The etching material may then be patterned through an appropriate exposure and development and/or etching process.

Once the region 50P has been masked, source/drain regions of the fins 52 in the region 50N are etched to form recesses in the fins 52. In some embodiments, gate spacers 86 are formed covering a portion of the sidewalls of the fins 52 that extend above the STI regions 56 to prevent growth of the source/drain regions 82 near the surface of the STI regions 56. However, in other embodiments, the spacer etch used to form the gate spacers 86 may be adjusted to remove the spacer material to allow the epitaxially grown region to extend to the surface of the STI region 56.

Once the recesses are formed in the fins 52 and, if desired, once the portions of the spacer material of the gate spacers 86 have been removed, the source/drain regions 82 in the region 50N are epitaxially grown in the recesses. The source/drain regions 82 may include any acceptable material, such as appropriate for n-type FinFETs. For example, if the fin 52 is silicon, the source/drain regions 82 in the region 50N may include materials exerting a tensile strain in the channel region 58, such as silicon, silicon carbide, phosphorous doped silicon carbide, silicon phosphide, or the like. The source/drain regions 82 in the region 50N may have surfaces raised from respective surfaces of the fins 52 and may have facets. Once the source/drain regions 82 in the region 50N have been formed, the mask formed in the region 50P may be removed (e.g., via an ashing process or etching process) to expose the fins 52 in the region 50P.

As a result of the epitaxy processes used to form the source/drain regions 82 in the region 50N, upper surfaces of the source/drain regions 82 have facets which expand laterally outward beyond sidewalls of the fins 52. In some embodiments, these facets cause adjacent source/drain regions 82 of a same FinFET to merge as illustrated by the two source/drain regions 82 in the region 50N on the left side of FIG. 10C.

The source/drain regions 82 in the region 50P, e.g., the PMOS region, may be formed by masking the region 50N, e.g., the NMOS region. The masking process used to form the mask over the region 50P may be utilized to form the mask over the region 50N. However, any suitable masking material and any suitable masking process may be utilized.

Once the region 50N has been masked, source/drain regions of the fins 52 in the region 50P are etched to form recesses in the fins 52. Furthermore, portions of the spacer material of the gate spacers 86 may be retained to cover portions of the sidewalls of the fins 52. However, in other embodiments, the portions of spacer material the source/drain regions may be removed. Then, the source/drain regions 82 in the region 50P are epitaxially grown in the recesses. The source/drain regions 82 may include any acceptable material, such as appropriate for p-type FinFETs. For example, if the fin 52 is silicon, the source/drain regions 82 in the region 50P may comprise materials exerting a compressive strain in the channel region 58, such as silicon-germanium, boron doped silicon-germanium, germanium, germanium tin, or the like. The source/drain regions 82 in the region 50P may also have surfaces raised from respective surfaces of the fins 52 and may have facets. Once the source/drain regions 82 in the region 50P have been formed, the mask formed in the region 50N may be removed (e.g., via an ashing process or etching process) to expose the source/drain regions 82 in the region 50N for further processing.

As a result of the epitaxy processes used to form the source/drain regions 82 in the region 50P, upper surfaces of the epitaxial source/drain regions have facets which expand laterally outward beyond sidewalls of the fins 52. In some embodiments, adjacent source/drain regions of a finFET device remain separated after the epitaxy process is completed as illustrated by the source/drain region 82 in the region 50P on the right side of FIG. 10C.

The source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the source/drain regions 82 may be in situ doped during growth.

Figure 11B:
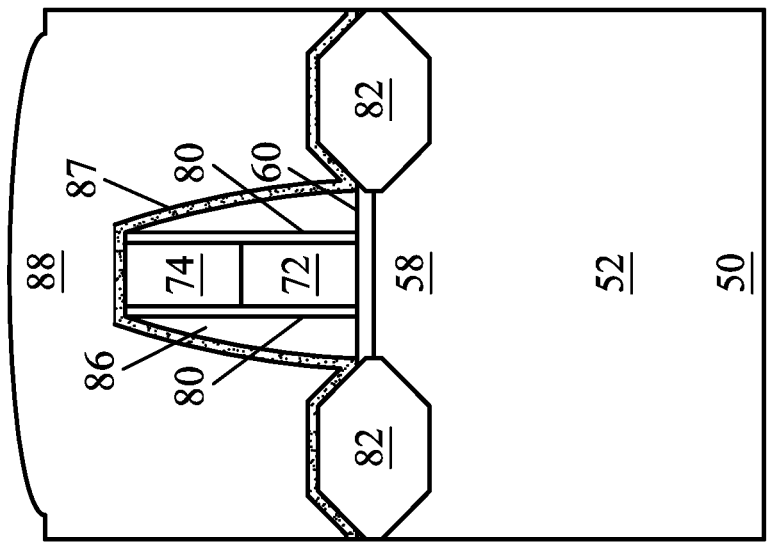
Figure 11A:
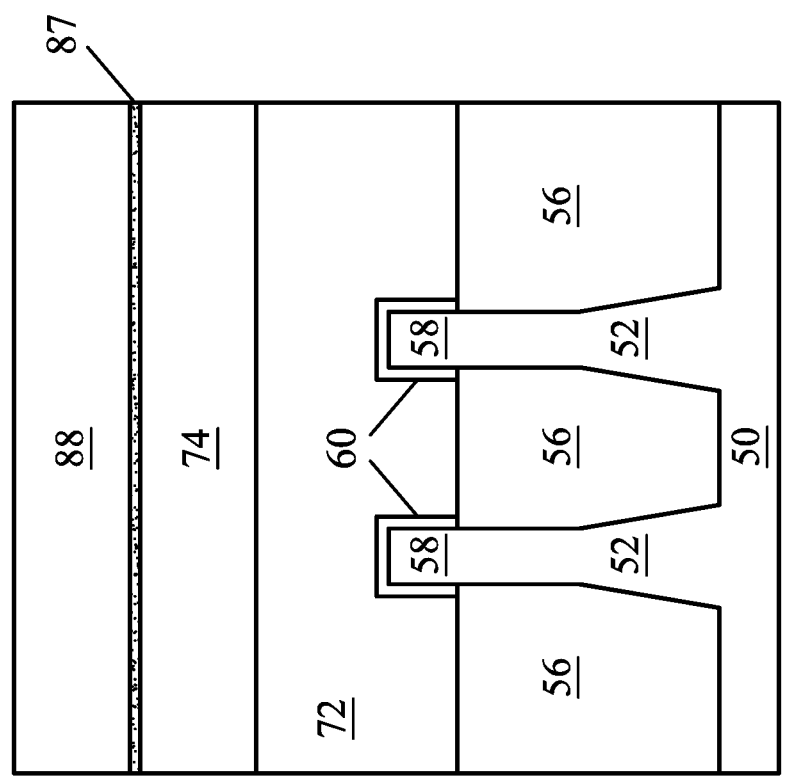
Figure 11C:
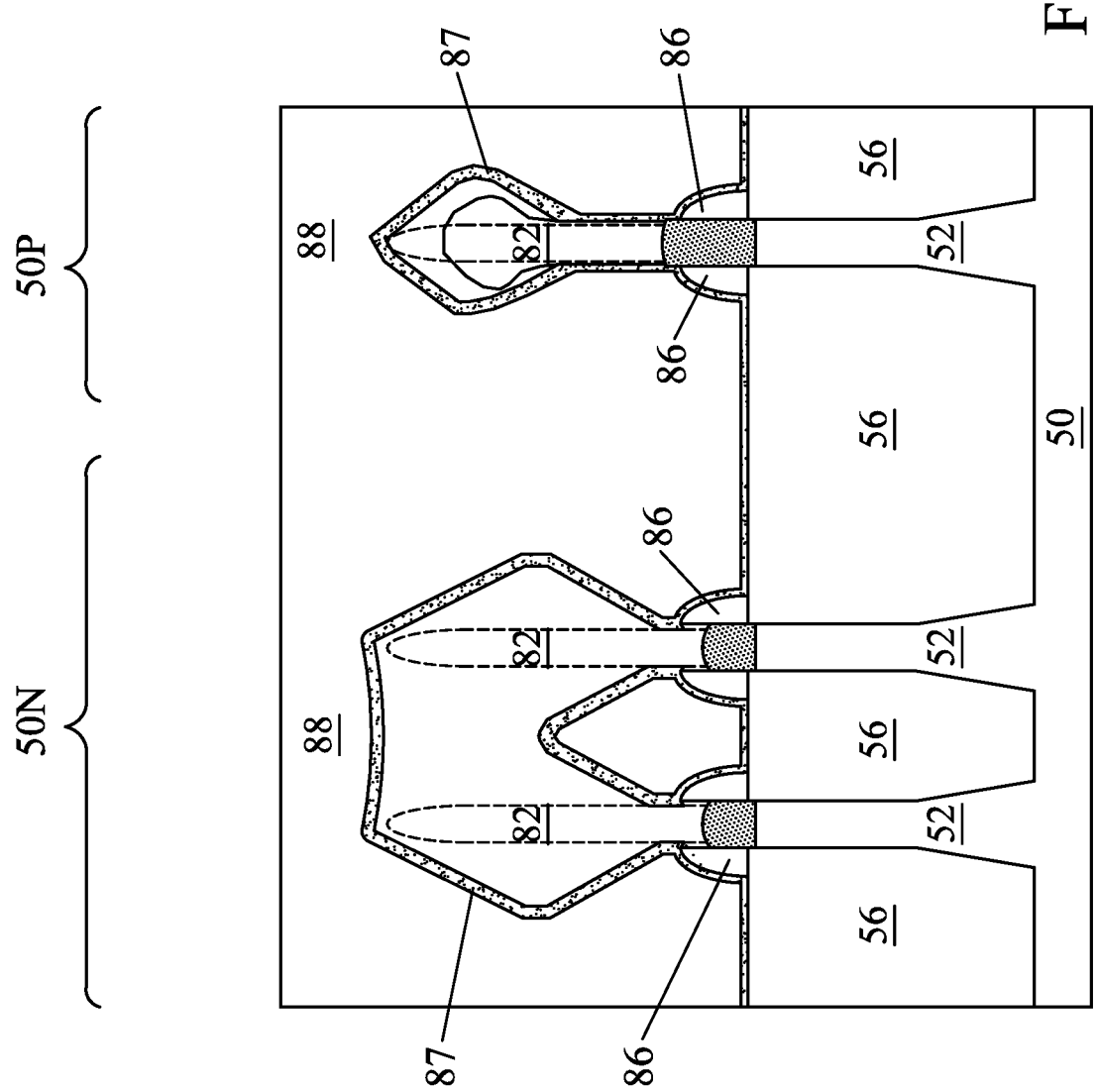

In FIGS. 11A-11C, a contact etch stop layer (CESL) 87 is deposited over the structure illustrated in FIGS. 10A-10C. According to embodiments disclosed herein, the dielectric material of the CESL 87 has a first etch rate as compared to a second etch rate of a dielectric material of a subsequently formed cut metal gate (CMG) isolation structure referred to herein as dielectric isolation region 162 that is discussed in detail below. In some specific embodiments the CESL 87 may comprise similar elements as the dielectric isolation region 162, but with additional elements added. For example, in embodiments in which the dielectric isolation region 162 comprises a material such as silicon nitride, the CESL 87 may comprise a material with silicon and nitride, but with an additional element, such as carbon also added to the material, such as silicon carbon nitride (SiCN). In some embodiments, the material of the CESL 87 comprises between about 15% and about 50% (by volume) of carbon (C) and in some embodiments, the material of the CESL 87 comprises between about 5% and about 20% (by weight) of carbon (C).

However, in other embodiments the CESL 87 may comprise other materials not related to the material of the dielectric isolation region 162, but still maintaining the desired separation in etch rates and etch selectivities. For example, in other embodiments the CESL 87 comprises a dielectric material, such as silicon oxide or any other suitable dielectric material, or the like. However, any suitable material may be utilized.

The dielectric material of the CESL 87 (e.g., SiCN) may be conformally deposited over the source/drain regions 82, the masks 74, and the gate spacers 86. According to some embodiments, the CESL 87 may be formed using a chemical vapor deposition (CVD) process to expose the structure illustrated in FIGS. 10A-10C to one or more precursors and to a plasma activation process conducted in a deposition chamber. The CVD process may be an atomic layer deposition (ALD), a plasma enhanced chemical vapor deposition (PECVD), a low pressure chemical vapor deposition (LPCVD), or the like.

In some embodiments, the precursors may be introduced to the structure separately as a first precursor and a second precursor, with the plasma activation process being performed on one of the introduced precursors in a repeated series of separately deposited materials. In other embodiments, the precursors may be introduced as a mixture in a repeated series of depositions of the mixture with the plasma activation process performed after each deposition of the repeated series of depositions of the mixture until a desired thickness of the CESL 87 has been formed.

According to some embodiments, the first precursor comprises silane (e.g., dichlorosilane $SiH_2Cl$ (DCS)) and the first precursor is flowed into the chamber with a flow rate of between about 1500 sccm and about 2500 sccm, such as about 2000 sccm. The second precursor comprises nitrogen (e.g., ammonia ($NH_3$)) that is flowed into the chamber with a flow rate of between about 4500 sccm and about 5500 sccm, such as about 5000 sccm. During the deposition process, process conditions are maintained at a pressure of between about 3.5 torr and about 4.5 torr, such as about 4 torr and at a temperature of between about 520° C. and about 590° C., such as about 550° C. A power of the plasma generator to turn the second precursor (e.g., $NH_3$) of the deposition process is maintained at a power of between about 100 W and about 120 W, such as about 110 W and at a frequency of between about 13 MHz to about 14 GHz for a duration of between about 25 sec and about 35 sec, such as about 30 sec. However, any suitable precursor materials and any suitable process conditions may be used to deposit the CESL 87.

According to some embodiments, the dielectric material of the CESL 87 is conformally deposited as a complex compound comprising SiN (e.g., SiCN, SiOCN, or the like) or other suitable compounds such as SiOC and is formed to a thickness of between about 20 Å and about 60 Å, such as about 40 Å. However, any suitable process conditions may be utilized. Furthermore, based on the deposition process (e.g., ALD, CVD, furnace, or the like) and the process conditions used, the coverage and conformity of the CESL 87 can be controlled. For example, the step coverage and conformity provided by ALD deposition is better than the step coverage and conformity provided by CVD. Furthermore, considering the controllability of the deposition process (e.g., ALD, CVD, furnace, and the like) used, the thickness uniformity of the CESL 87 can be controlled within a range of between about ±20%.

FIGS. 11A-11C further illustrate a first interlayer dielectric (ILD) 88 that is deposited over the CESL 87. The first ILD 88 may be formed of a dielectric material, and may be deposited by any suitable method, such as CVD, plasma-enhanced CVD (PECVD), or flowable chemical vapor deposition (FCVD). Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

Figure 12B:
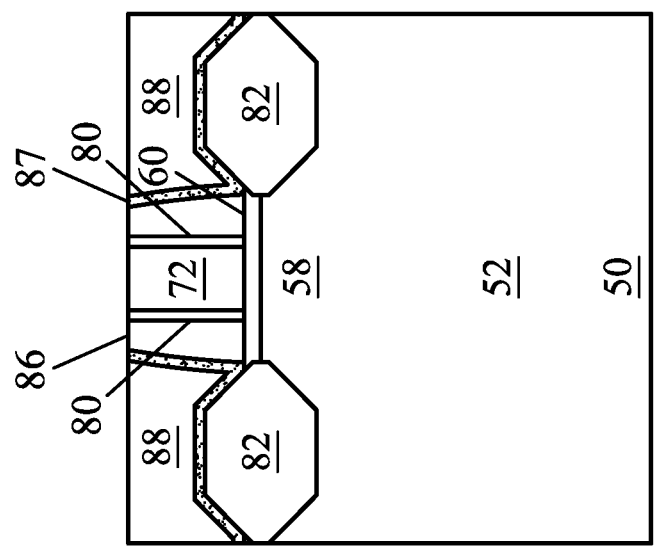
Figure 12A:
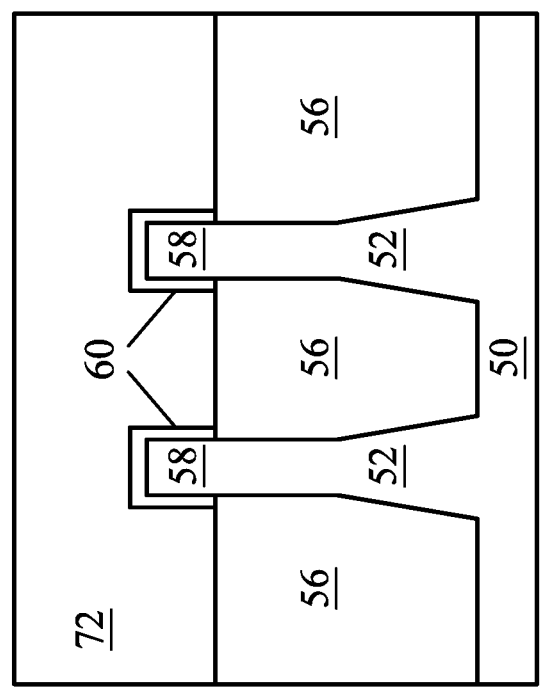

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 13B:
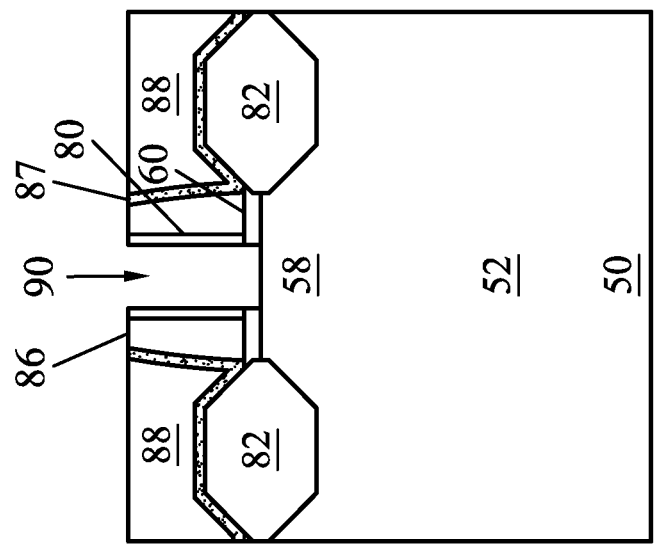
Figure 13A:
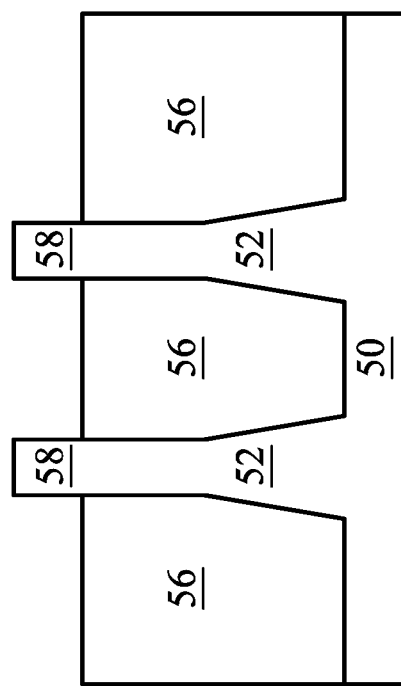

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a fin 52. Each channel region 58 is disposed between neighboring pairs of the source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
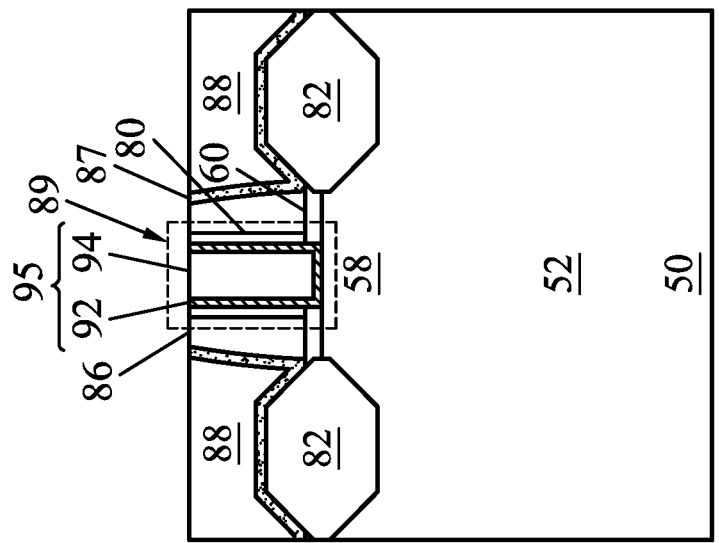
Figure 14A:
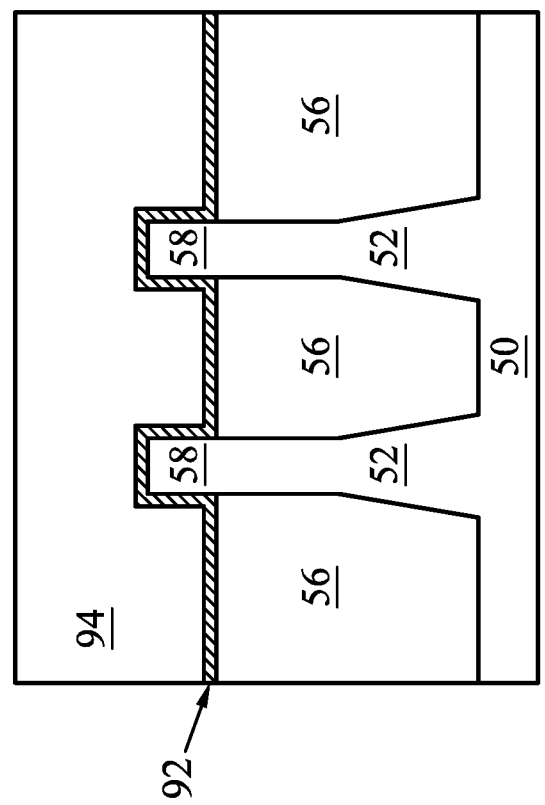
Figure 14C:
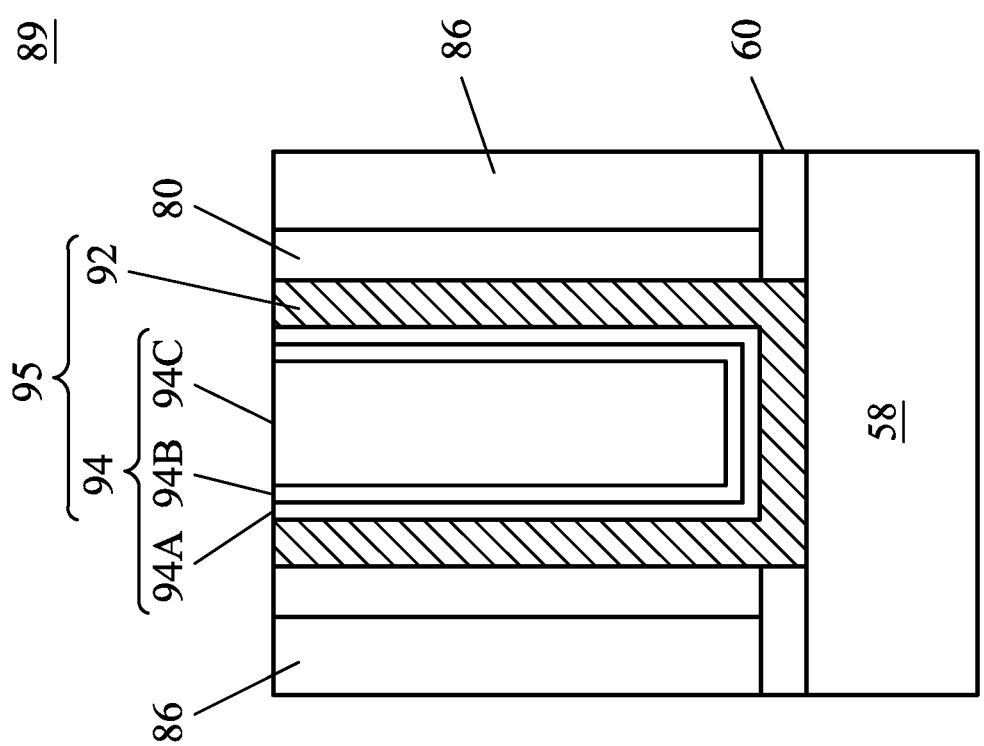

In FIGS. 14A and 14B, gate dielectric layers 92 and gate electrodes 94 are formed for replacement gates. FIG. 14C illustrates a detailed view of region 89 of FIG. 14B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode is illustrated in FIG. 14B, the gate electrode 94 may comprise any number of optional liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 are in combination referred to as replacement gate stacks or metal gate stack 95 of the resulting FinFETs. As such, the metal gate stack 95 extends along sidewalls of a channel region 58 of the fins 52, as illustrated in FIGS. 15A-15D.

Furthermore, the metal gate stack 95 of p-type FinFETs and the metal gate stack 95 of n-type FinFETs may be different from each other so that the work functions of the metal gate stacks 95 are suitable for the respective p-type or n-type FinFETs. The fill material 94C used to form the metal gate stack 95 may include aluminum, copper, tungsten, cobalt, or the like.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

In FIGS. 15A-15D, in accordance with some embodiments, the metal gate stack 95 is recessed, so that a recess is formed directly over the metal gate stack 95 and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88. The material of the gate mask 96 may be the same as or different from the material of the gate dielectric layers 92, the first ILD 88, and/or the gate spacers 86. In accordance with some embodiments of the present disclosure, the formation of the gate mask 96 includes recessing the metal gate stack 95 through etching to form recesses, filling a dielectric material into the recesses, and performing a planarization to remove the excess portions of the dielectric material. As such, the remaining portions of the dielectric material form the gate mask 96 that is planarized with the surfaces of the gate seal spacers 80, the gate spacers 86, CESL 87 and the first ILD 88. In accordance with some embodiments of the present disclosure, gate mask 96 is formed of silicon nitride, silicon oxynitride, silicon oxycarbide, silicon oxy carbo-nitride, or the like.

Once the gate mask 96 has been formed, an etching mask for a cut metal gate process may be deposited over the surfaces of the gate mask 96, the gate seal spacers 80, the gate spacers 86, and the CESL 87 that are planarized with the first ILD 88. The etching mask is then patterned to form an opening in the etching mask. According to some embodiments, the etching mask may be formed of a material such as photo resist, titanium nitride, boron nitride, silicon nitride, or the like, and the material of the etching mask is different from the materials of the underlying features of the gate mask 96, the gate seal spacers 80, the gate spacers 86, the CESL 87, the first ILD 88, the gate dielectric layer 92 and the gate electrode 94. When the etching mask is formed of a non-photo-resist material, a patterned photo resist may be formed over the etching mask and the patterned photo resist is used as an etching mask to transfer a desired pattern into the etching mask to form the opening through the etching mask. According to some embodiments, the opening formed in the etching mask not only exposes a portion of the gate electrode 94 but also extends over and exposes the surfaces of the materials planarized with the first ILD 88 in an area extending between the regions 50N and 50P and extending between the source/drain regions 82 disposed on opposing sides of the gate electrode 94 in a direction substantially perpendicular to the gate electrode 94.

Once a desired pattern has been formed in the etching mask, an etching process is performed using the patterned etching mask to remove regions (e.g., materials of the gate electrode 94 and exposed portions of the first ILD 88) of the underlying materials exposed through the opening in the etching mask. According to some embodiments, etching of the materials during the CMG process is performed using process gases selected from, and not limited to, $SiCl_4$, $O_2$, $C_4F_6$, HBr, He, and combinations thereof. The etching may be performed with a pressure in the range between about 3 mTorr and about 10 mTorr for a period of between about 500 sec and about 900 sec, such as about 700 sec. An RF power is applied in the etching, and the RF power may be in the range between about 500 Watts and about 900 Watts. A bias voltage is also applied.

Figure 15B:
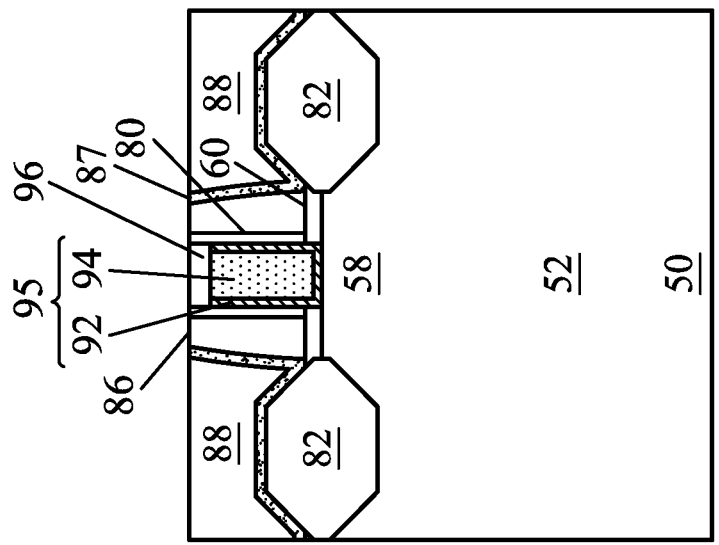
Figure 15A:
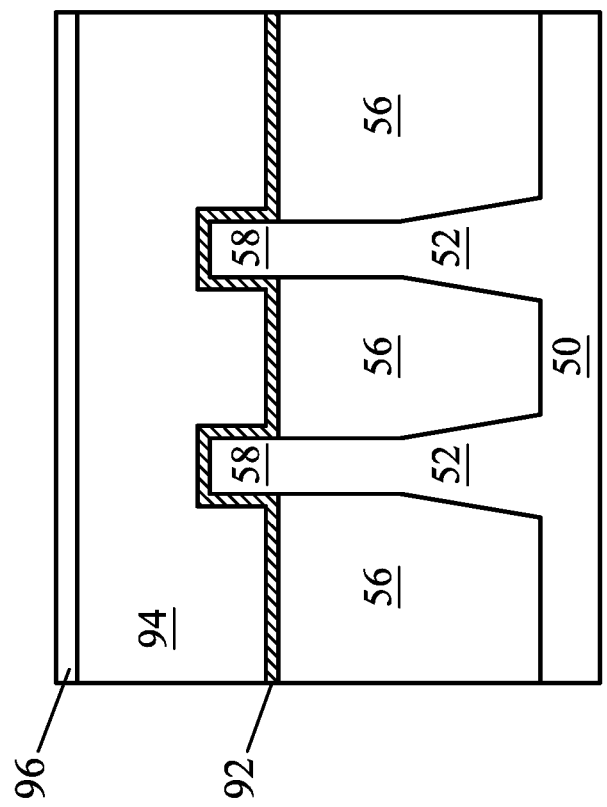
Figure 15C:
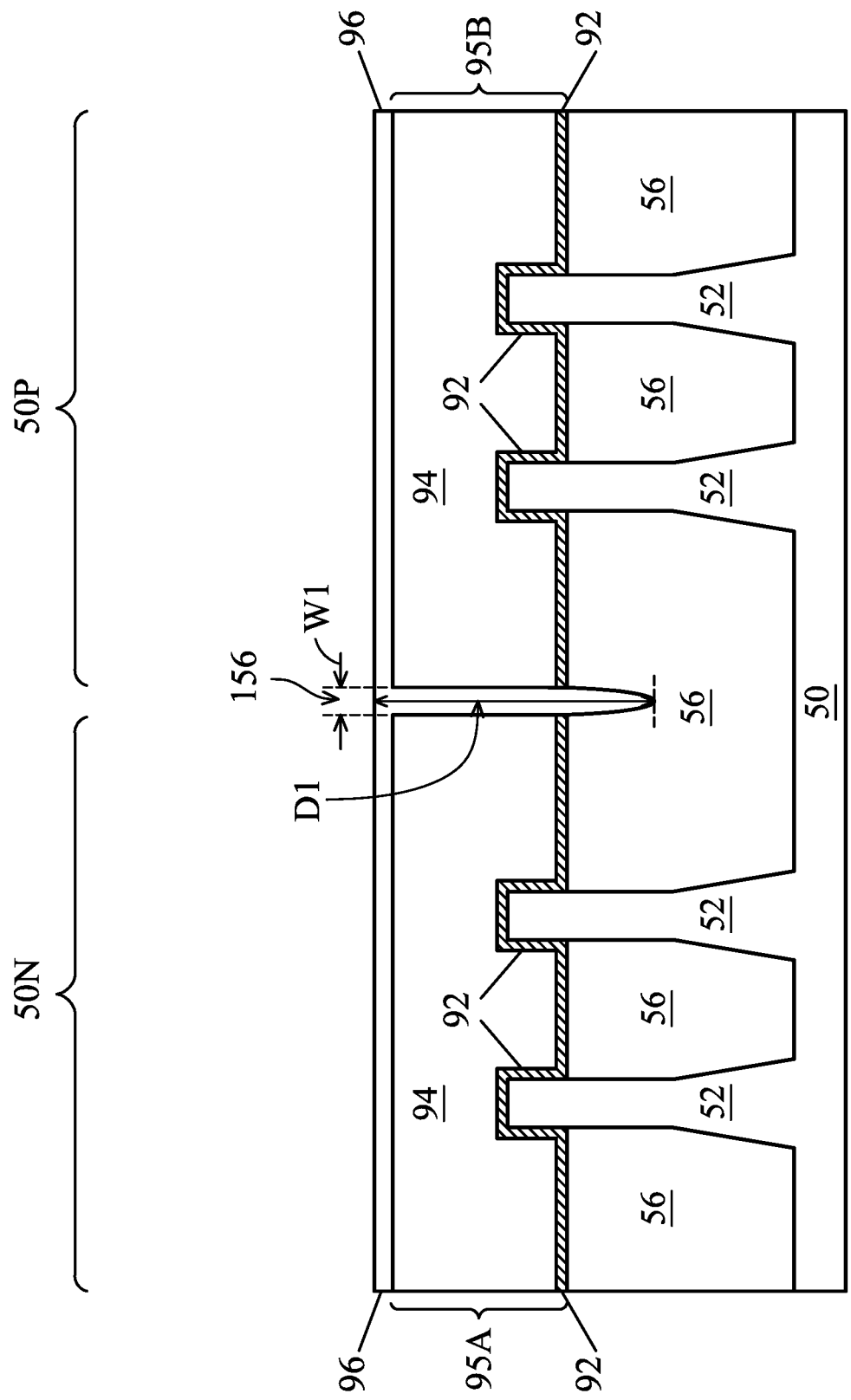
Figure 15D:
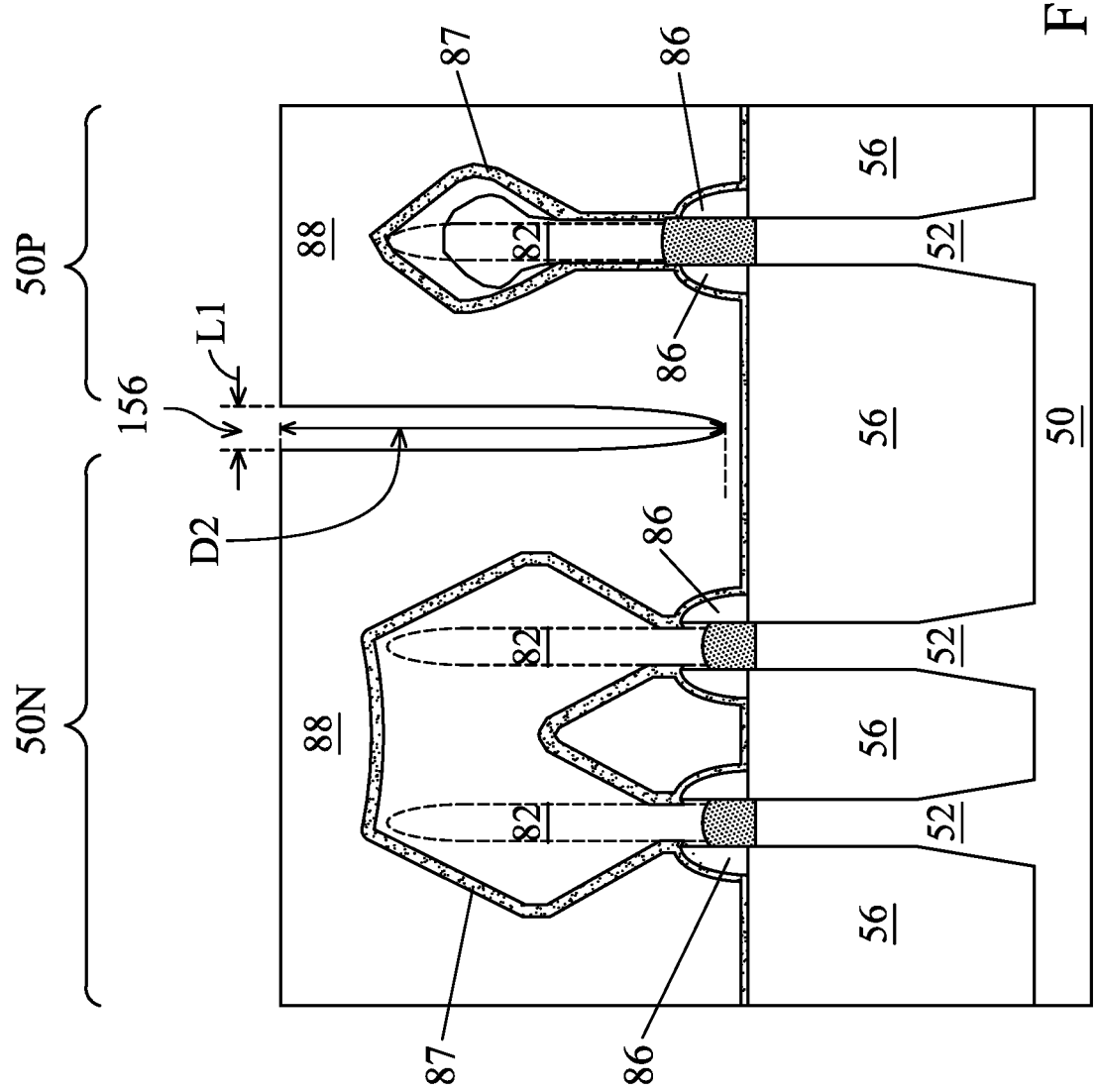

FIGS. 15C and 15D illustrate the formation of a cut metal gate (CMG) opening 156 using the etching process, according to some embodiments. The CMG opening 156 may be formed between the region 50N and the region 50P of adjacent devices to cut the metal gate stack 95 into separate portions with each of these separate portions serving as a metal gate stack 95A of an n-type device of the region 50N and as a metal gate stack 95B of a p-type device of the region 50P, according to some embodiments. Accordingly, the separation of the metal gate stack 95 into the separate portions may be referred to as a CMG process.

In some embodiments, the etching used to form the CMG opening 156 is anisotropic, and hence the sidewalls of the CMG opening 156 are substantially vertical. During the etching in the CMG process, the desired portions of the gate mask 96, the gate seal spacers 80, the gate spacers 86, the CESL 87, the first ILD 88, the gate dielectric layer 92 and the gate electrode 94 between the region 50N and the region 50P are removed as can be seen in FIGS. 14A-15D. Accordingly, the underlying portions of the STI regions 56 are exposed. The etching may be stopped at a desired intermediate level between a top surface and a bottom surface of the STI regions 56. The etching gas is selected to mainly attack the metals in the metal gate stack 95 to ensure the removal of these metals. Accordingly, the etching rates of the first ILD 88, the CESL 87, the gate spacers 86, and the STI regions 56 may be lower than the etching rate of the metal gate stack 95. As such, the CMG opening 156 extends to a first depth D1 in a first area of the A-A cutline between the separated portions of the metal gate stack 95 (shown in FIG. 15C) and, in a second area of the C-C cutline between the source/drain regions 82 of the adjacent devices (shown in FIG. 15D), the CMG opening 156 extends to a second depth D2, the first depth D1 being greater than the second depth D2.

According to some embodiments, the CMG opening 156 may be formed to have a first width W1 at the planarized surface of the first ILD 88 of between about 10 nm and about 40 nm, such as about 26 nm and a first length L1 of between about 5 nm and about 25 nm, such as about 15 nm. Furthermore, in some embodiments, the CMG opening 156 may extend from the planarized surface of the first ILD 88 into the STI region 56 to the first depth D1 of between about 70 nm and about 210 nm, such as about 140 nm and may extend from the planarized surface into the first ILD 88 to the second depth D2 of between about 50 nm and about 110 nm, such as about 80 nm. However, any suitable widths and any suitable depths may be used for the CMG opening 156. In some embodiments, in the second area of the C-C cutline between the source/drain regions 82 of the adjacent devices of the region 50N and the region 50P, the CMG opening 156 extends substantially through, but not entirely through, the first ILD 88 to the second depth D2 of between about 70 nm±20% (shown in FIG. 15D). In other embodiments, the CMG opening 156, in the second area of the C-C cutline between the source/drain regions 82 of the adjacent devices of the region 50N and the region 50P, may extend entirely through the first ILD 88 and into the STI region 56 (not shown in FIG. 15D) down to the second depth D2 of between about 120 nm±20%. Once the CMG opening 156 has been formed, the etching mask may be removed for example by a CMP process or an etching process.

FIGS. 16A-16D illustrate the formation of a dielectric isolation region 162 within the CMG opening 156 (FIG. 15C) with an isolation layer 160 formed over the planar surfaces of the first ILD 88. FIGS. 16A-16D further illustrate a second ILD 108 formed over the isolation layer 160 and a masking layer 163 formed over the second ILD 108 and then patterned in preparation of further processing.

Figures 16A, 16B:
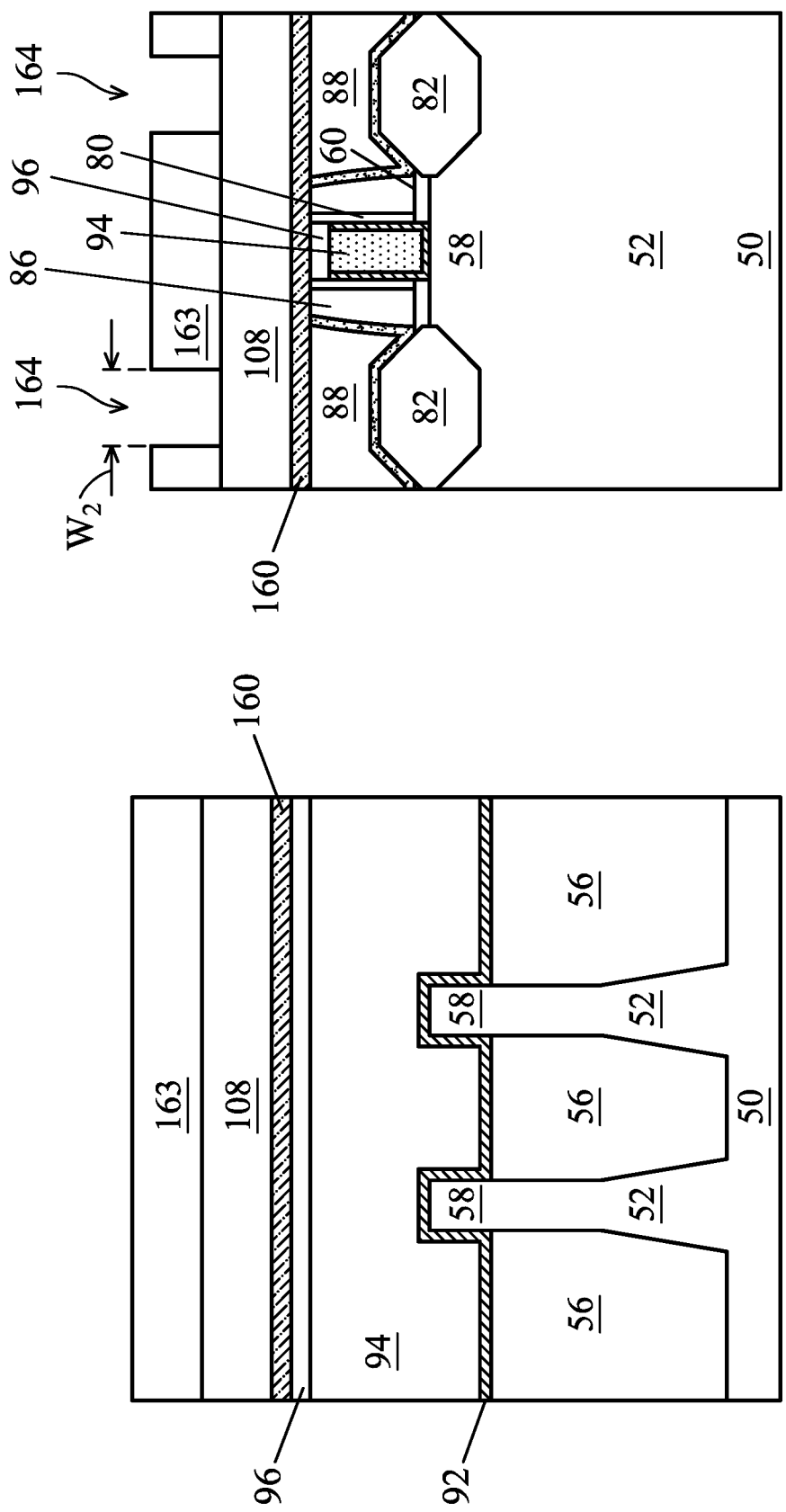
Figure 16C:
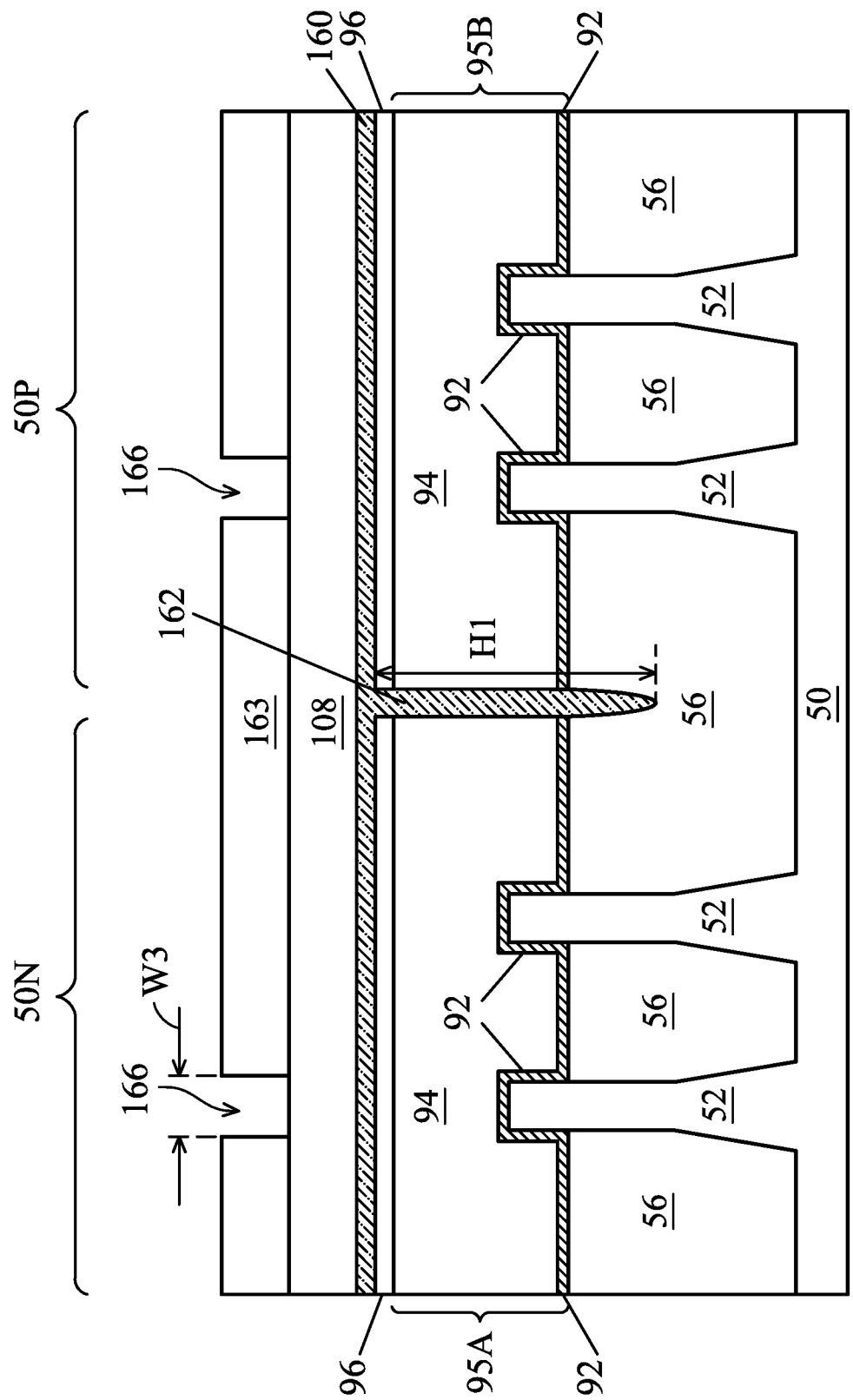
Figure 16D:
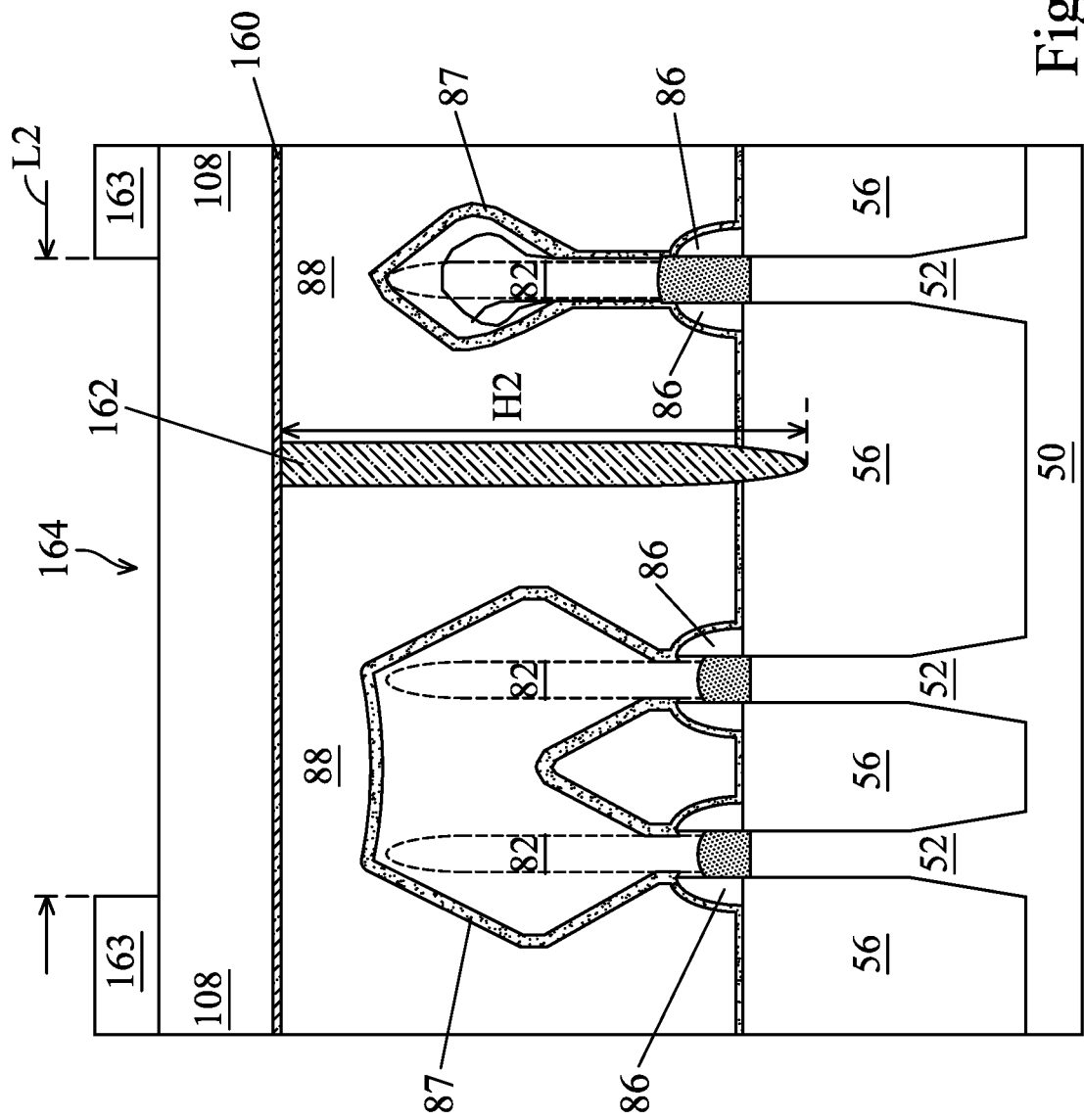

With reference to FIGS. 16C and 16D the dielectric isolation region 162 is formed within the CMG opening 156 (FIG. 15C) to separate the metal gate stack 95 into metal gate stack 95A and metal gate stack 95B of adjacent devices in the region 50N and the region 50P, respectively. According to some embodiments, the dielectric isolation region 162 is formed by depositing a dielectric fill material to fill or to overfill the CMG opening 156 of FIGS. 15C and 15D. According to some embodiments, the dielectric isolation region 162 is formed to a first height H1 of between about 120 nm±20%, in the channel region, as illustrated in FIG. 16C and in embodiments where the CMG opening 156 extends into the STI region 56 of the source/drain region, dielectric isolation region 162 may be formed to a second height H2 of between about 120 nm±20%, in the source/drain region, as illustrated in FIG. 16D. In other embodiments where the second depth D2 of the CMG opening 156 in the source/drain region remains above the STI region 56 (shown in FIG. 15D), the dielectric isolation region 162 in the source/drain region also remains above the STI region 56 (not shown in FIG. 16D). As such, the second height H2 of the dielectric isolation region 162 in the source/drain region may be less than the first height H1 of the dielectric isolation region 162 in the channel region. For example, the second height H2 may be between about 70 nm±20%. The deposition method may include plasma enhanced chemical vapor deposition (PECVD), physical vapor deposition (PVD) atomic layer deposition (ALD), low pressure chemical vapor deposition (LPCVD), spin-on coating, or the like and the dielectric fill material is different from the material of the CESL 87 (FIG. 16B). According to some embodiments, the dielectric fill material comprises silicon nitride, silicon oxide, silicon carbide, silicon oxynitride, silicon oxy-carbide, or the like. However, any suitable deposition method and any suitable dielectric fill material may be used.

Once deposited, the dielectric fill material is planarized using a process such as a CMP process or a mechanical grinding process to remove the excess portions of the dielectric fill material. In some embodiments, the planarization process is performed such that a portion of the dielectric fill material remains as the isolation layer 160 over the dielectric isolation region 162 and over the planar surfaces of the remaining portions of the gate mask 96, the first ILD 88, the CESL 87, the gate spacers 86, and the gate seal spacers 80. According to some embodiments, the isolation layer 160 may be formed to a thickness of between about 10 Å and about 200 Å, such as about 50 Å. However, any suitable thickness may be used for the isolation layer 160.

FIGS. 16A-16D further illustrate a second ILD 108 deposited over the isolation layer 160 using any of the materials and any of the methods used to form the first ILD 88. In some embodiments, the material of the second ILD 108 may be the same as the material of the first ILD 88. Although, the material of the second ILD 108 may be different from the material of the first ILD 88. However, any suitable materials and any suitable deposition methods may be used to form the second ILD 108. In some embodiments, the second ILD 108 may be formed to a thickness of between about 10 Å and about 500 Å, such as about 100 Å. However, any suitable thickness may be used for the second ILD 108.

FIGS. 16A-16D further illustrates a photolithography process for depositing and patterning the masking layer 163 over the second ILD 108. According to some embodiments, the masking layer 163 is deposited using any suitable deposition process, may be formed to any suitable thickness, and may be patterned using any suitable photolithography method to form openings through the masking layer 163 and to expose surfaces of the second ILD 108 in areas overlying the source/drain regions 82 and/or overlying the metal gate stack 95.

FIGS. 16A and 16B illustrate, according to some embodiments, depositing the masking layer 163 and forming first openings 164 through the masking layer 163 to expose areas of the second ILD 108 overlying the source/drain regions 82. According to some embodiments, the first openings 164 may be formed to a second width W2 of between about 12 nm and about 18 nm, such as about 15 nm and, as illustrated in FIG. 16D, the first openings 164 may be formed to a second length L2 of between about 60 nm and about 120 nm, such as about 90 nm. FIG. 16C illustrates, according to some embodiments, forming second openings 166 through the masking layer 163 to expose one or more areas of the second ILD 108 overlying the metal gate stacks 95, for example, in the region 50N and the region 50P. According to some embodiments, the second openings 166 may be formed to a third width W3 of between about 8 nm and about 20 nm, such as about 14 nm. Once patterned with the first openings 164 and/or the second openings 166, the masking layer 163 may serve as a mask to form contact plugs through the second ILD 108 for the metal gate stack 95 and for the source/drain regions 82.

Figure 17:
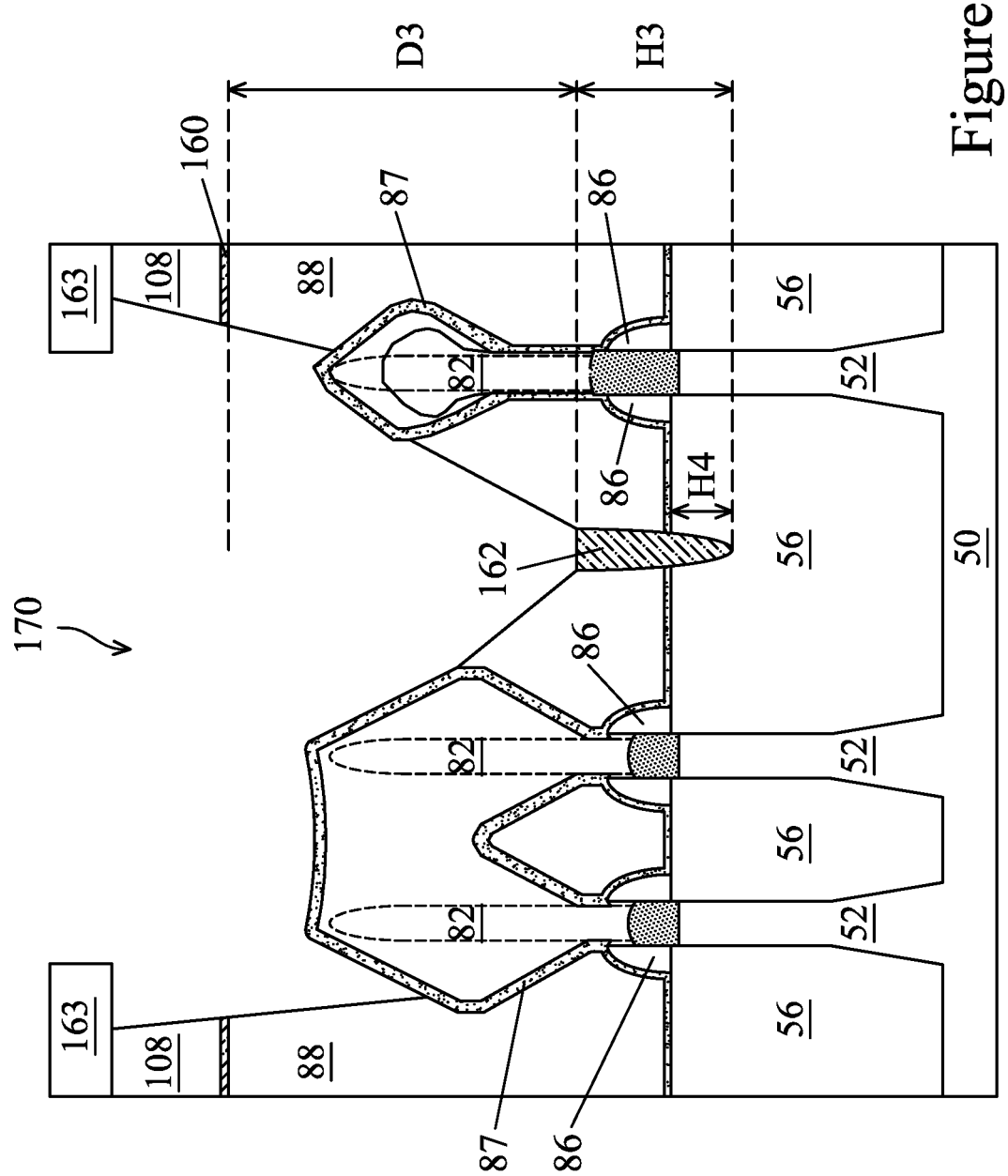

FIG. 17 illustrates the formation a contact via opening 170 over the source/drain regions 82 of the adjacent devices in the region 50N and the region 50P. As such, surfaces of the CESL 87 surrounding the source/drain regions 82 of the adjacent devices in the region 50N and the region 50P are exposed through the contact via opening 170.

Once the masking layer 163 has been patterned, the masking layer 163 is used during the etching process to transfer the pattern of the first openings 164 and/or the second openings 166 through the second ILD 108 using the isolation layer 160 as an etch stop layer of the etching process. As such, contact via openings may be formed through the second ILD 108. In some embodiments, the masking layer 163 is applied and patterned such that the first openings 164 and the second openings 166 are etched through the second ILD 108 at a same time to transfer the pattern of the masking layer 163 into the second ILD 108. In other embodiments, the patterns of the first openings 164 in the masking layer 163 are transferred into the second ILD 108 separately from the transferring of the patterns of the second openings 166 in the masking layer 163.

According to some embodiments, etchants having a high selectivity for the materials of the second ILD 108 and a low selectivity of the materials of the isolation layer 160 may be used to remove the materials of the second ILD 108. As such, the contact via openings 170 are formed through the second ILD 108 and surfaces of the isolation layer 160 are exposed through the contact via openings. According to some embodiments, etchants used to form the contact via openings through the second ILD 108 include, but are not limited to, carbon-and-fluorine-containing gases such as $CF_4$, $CH_2F_2$, $CHF_3$, or the like. However, any suitable gasses may be used.

In some embodiments, an anisotropic reactive ion etching (RIE) process is used to form the contact via openings 170 in the second ILD 108. The RIE process uses one or more of the carbon-and-fluorine-containing gases and performs the etching process with a pressure in the range between about 3 mTorr and about 10 mTorr for a period of between about 300 sec and about 1200 sec, such as about 750 sec. An RF power is applied in the etching, and the RF power may be in the range between about 500 Watts and about 900 Watts. A bias voltage is also applied.

Once the areas of the surface of the isolation layer 160 are exposed through the contact via openings 170 in the second ILD 108, another etching process is utilized to extend the contact via openings 170 through the isolation layer 160. Additionally, during this etching process the material of the isolation layer 160 will be etched faster than the material of the underlying first ILD 88, so the material of the dielectric isolation region 162 (e.g., SiN) will also recess faster than the first ILD 88, resulting in a pullback of the dielectric isolation region 162 (e.g., a SiN pull-back).

During such a pull-back, portions of the isolation layer 160 exposed through the one or more first openings 164 and/or second openings 166 are removed and the dielectric isolation region 162 is recessed in the source/drain region. In some embodiments, the dielectric isolation region 162 in the source/drain region may be reduced from the second height H2 (shown in FIG. 16D) of between about 120 nm±20%, for example, to a third height H3 of between about 30 nm±20% or, for example, between about 40 nm±10%. Furthermore, a portion of the dielectric isolation region 162 is embedded in the STI region 56. According to some embodiments, the embedded portion of the dielectric isolation region 162 may have a fourth height H4 of about 80 nm±20% or between about 60 nm and about 100 nm, such as about 80 nm. A first ratio R1 of the fourth height H4 to the second height H2 may be determined using the formula: R1=H4/H2 wherein R1 is between about 1:1 and about 1:2, such as about 1:1.5. Once the dielectric isolation region 162 has been recessed, areas at the surface of the underlying first ILD 88 are exposed through openings in the isolation layer 160. According to some embodiments, the pull-back etch uses etchants having a high selectivity for the materials of the isolation layer 160 and the dielectric isolation region 162 and having a relatively low selectivity for the materials of the first ILD 88 in the planarized surface underlying the isolation layer 160.

According to some embodiments, the pull-back etch process may be an isotropic reactive ion etching (RIE) process using one or more of the carbon-and-fluorine-containing gases and performing the RIE process with a pressure in the range between about 3 mTorr and about 10 mTorr for a period of between about 200 sec and about 1200 sec, such as about 750 sec. However, any suitable pressures and any suitable times may be used. An RF power is applied in the etching and the RF power may be in the range between about 500 Watts and about 900 Watts. A bias voltage is also applied. However, any suitable RF power and any suitable bias voltages may be used. As such, surface areas of the planarized surface underlying the isolation layer 160 are exposed through the one or more first openings 164 and/or second openings 166 and the isolation layer 160 is recessed to a depth of between about 40 nm and about 100 nm, such as about 70 nm. However, the isolation layer 160 may be recessed to any suitable depth.

Once the pull-back etch is complete, a timed etch may be performed to recess portions of the first ILD 88 and to expose the surfaces of the CESL 87 through the contact via openings 170. According to some embodiments, the first ILD 88 is recessed using one or more etching processes (e.g., dry etch, physical etching process, bombardment etch, or the like) to a third depth D3 of between about 40 nm and about 60 nm, such as about 50 nm. In some embodiments, the first ILD 88 is recessed to the third depth D3 of between about 80 nm±20%. However, any suitable depth may be utilized.

In some embodiments, the timed etch may use a physical etching process (e.g., ion beam etch (IBE), reactive ion beam etch (RIBE), bombardment etch, sputtering etch, or the like) to recess the first ILD 88. The physical etching process uses a process gas, such as, an inert gas (e.g., argon (Ar)) to accelerate ions at the exposed materials within the contact via openings 170 and to recess exposed portions of the first ILD 88 to the third depth D3. However, any suitable process gases and any suitable depth may be used to recess the first ILD 88.

Figure 18:
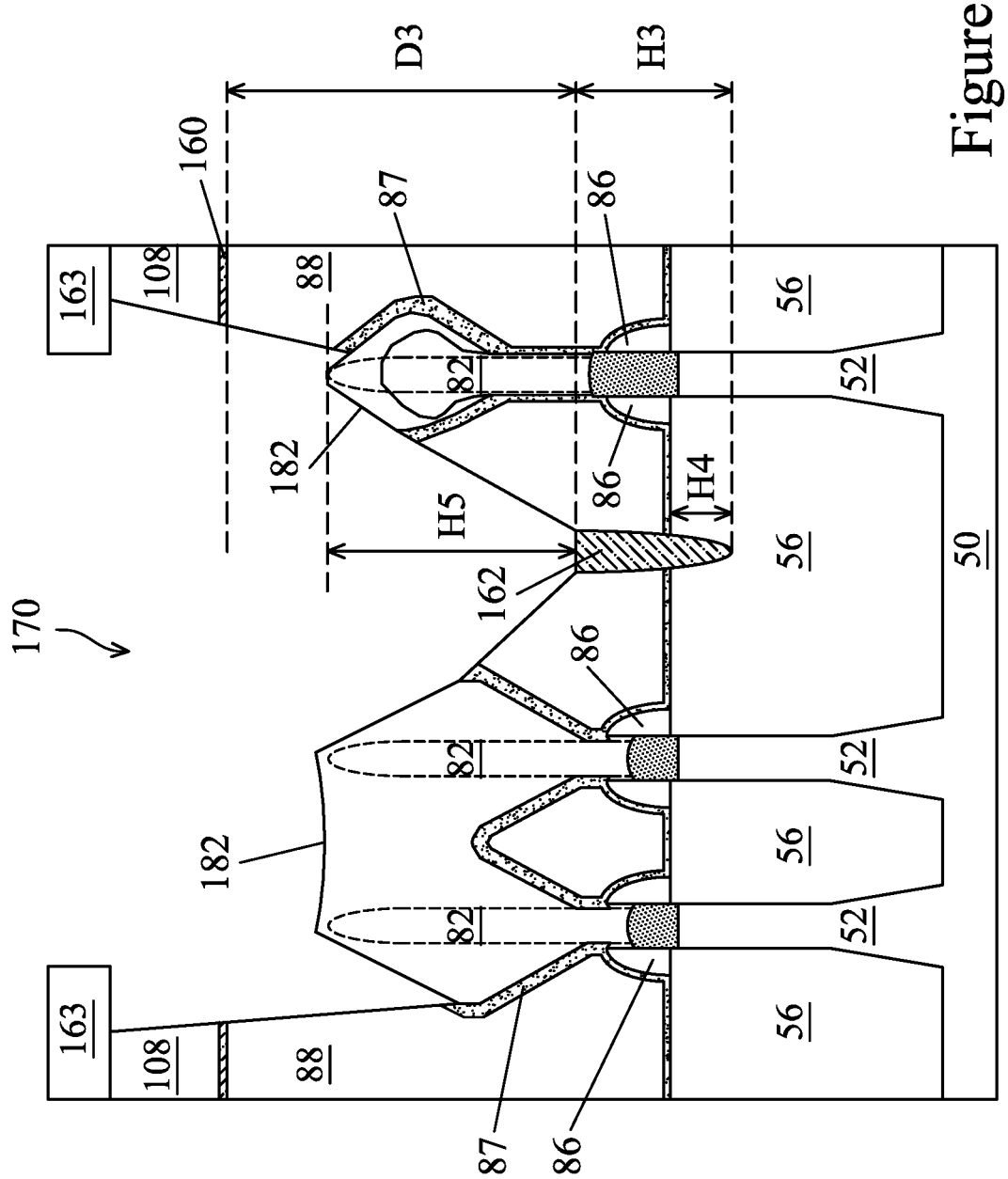

FIG. 18 illustrates that, once the first ILD 88 has been recessed, an etch stop removal process is used to remove portions of the CESL 87 and to expose surfaces of the epitaxial growth 182 of the source/drain regions 82 of the adjacent devices in the region 50N and the region 50P. According to some embodiments, the portions of the CESL 87 are removed using one or more etching processes (e.g., dry etch, wet etch, physical etching process, bombardment etch, or the like) using etchants selective to the material of the CESL 87 and relatively less selective to the epitaxial growth 182 of the source/drain regions 82. As such, the CESL 87 prevents the epitaxial growth 182 from being removed during etching of the first ILD 88 and, due to the relative selectivity of the CESL 87 to that of the epitaxial growth 182 during the removal of the CESL 87, the percentage loss of the epitaxial growth 182 is limited to between about 5% and about 20% (by volume). For example, in embodiments where the source/drain region 82 comprises silicon based materials (e.g., SiGe, SiP, SiCP, or the like) and where the epitaxial growth 182 comprises a critical dimension (CD) of between about 30 nm and about 80 nm, the material loss of the epitaxial growth 182 is limited to between about 5 nm and about 10 nm during the CESL 87 removal. FIG. 18 further illustrates that, once the portions of the CESL 87 have been removed, a topmost portion of the epitaxial growth 182 remains a fifth height H5 above the topmost portion of the dielectric isolation region 162. In some embodiments, the fifth height H5 is between about 30 nm±20% or between about 20 nm and about 40 nm, such as about 30 nm. According to some embodiments, a second ratio R2 of the fifth height H5 to the second height H2 may be determined using the formula: R2=H5/H2 wherein R2 is between about 1:6 and about 1:3, such as about 1:4. However, any suitable heights and any suitable ratios may be used.

According to an embodiment, the etch stop removal comprises a wet etch process to remove the exposed portions of the CESL 87. For example, a wet etch may be used with an etchant such as HF, although other etchants, such as gaseous $H_2$ may be used. According to some embodiments, the etch stop removal may be performed using a wet etch performed at a process temperature of between about 20° C. and about 100° C., such as about 60° C., and for a period of time of between about 10 sec and about 90 sec, such as about 50 sec. However any suitable temperatures and any suitable periods of time may be used to perform the etch stop removal. Furthermore, any other suitable methods, such as a reactive ion etching (RIE) or a dry etch with etchants such as $NH_3/NF_3$, may be used to remove the exposed portions of the CESL 87.

In other embodiments, the etch stop removal may be performed using a physical etching process (e.g., ion beam etch (IBE), reactive ion beam etch (RIBE), bombardment etch, sputtering etch, or the like), as discussed above, to remove the exposed portions of the CESL 87. According to some embodiments, the physical etch process used to perform the etch stop removal may be performed using an inert process gas (e.g., Ar, Xe, Ne or Kr) and using a process beam energy (e.g., voltage $V_B$).

In a specific embodiment, the physical etching process (e.g., ion beam etch (IBE)) that was used to recess the first ILD 88 may also be used to perform the etch stop removal for the CESL 87, although with different etching parameters.

For example, a first physical etching process may be performed to recess the first ILD 88 using a first process gas with a first flow rate and using a first beam energy for a first period of time. After the first time period, a second physical etching process may be performed to remove the exposed portions of the CESL 87 by using a second process gas with a second flow rate and using a second beam energy for a second period of time. In some embodiments, the second process gas may be the same as the first process gas (e.g., Ar) and the second physical etching process may be performed by increasing the beam energy used in the first physical etching process from the first beam energy to the second beam energy.

According to embodiments described herein, the dielectric material of the CESL 87 during the etch process has a first etch rate and the material of the dielectric isolation region 162 has a second etch rate that is less than the first etch rate of the CESL 87. Although specific embodiments have been disclosed with respect to physical etching processes used to recess the first ILD 88 and to remove the exposed portions of the CESL 87, it is understood that any combination of the first etching process suitable for the selective removal of the material of the first ILD 88 and the second etching process suitable for the selective removal of the exposed portions of the CESL 87 may be used. Furthermore, based on the material compositions of the first ILD 88 and the CESL 87 and their respective etch rates, the desired depth of recession of the first ILD 88 and the thickness of the CESL 87, the process parameters (e.g., temperatures, process gases, flow rates, beam energies, and/or periods of time) used to recess the first ILD 88 and used to remove portions of the CESL 87 may be the same or may be different. According to some embodiments, the selectivity of the dielectric layers (e.g., the second ILD 108, the isolation layer 160, the dielectric isolation region 162, the first ILD 88, and the CESL 87) can be modulated during the etching process by changing process conditions (e.g., gas species, gas ratios, power, frequency, pressure, combinations thereof, and the like). For example, in some embodiments, a wet etch utilizing HF could be used which results in the etch selectivity ratio between the first ILD 88 and the CESL 87 is about 3:1.

Figure 19C:
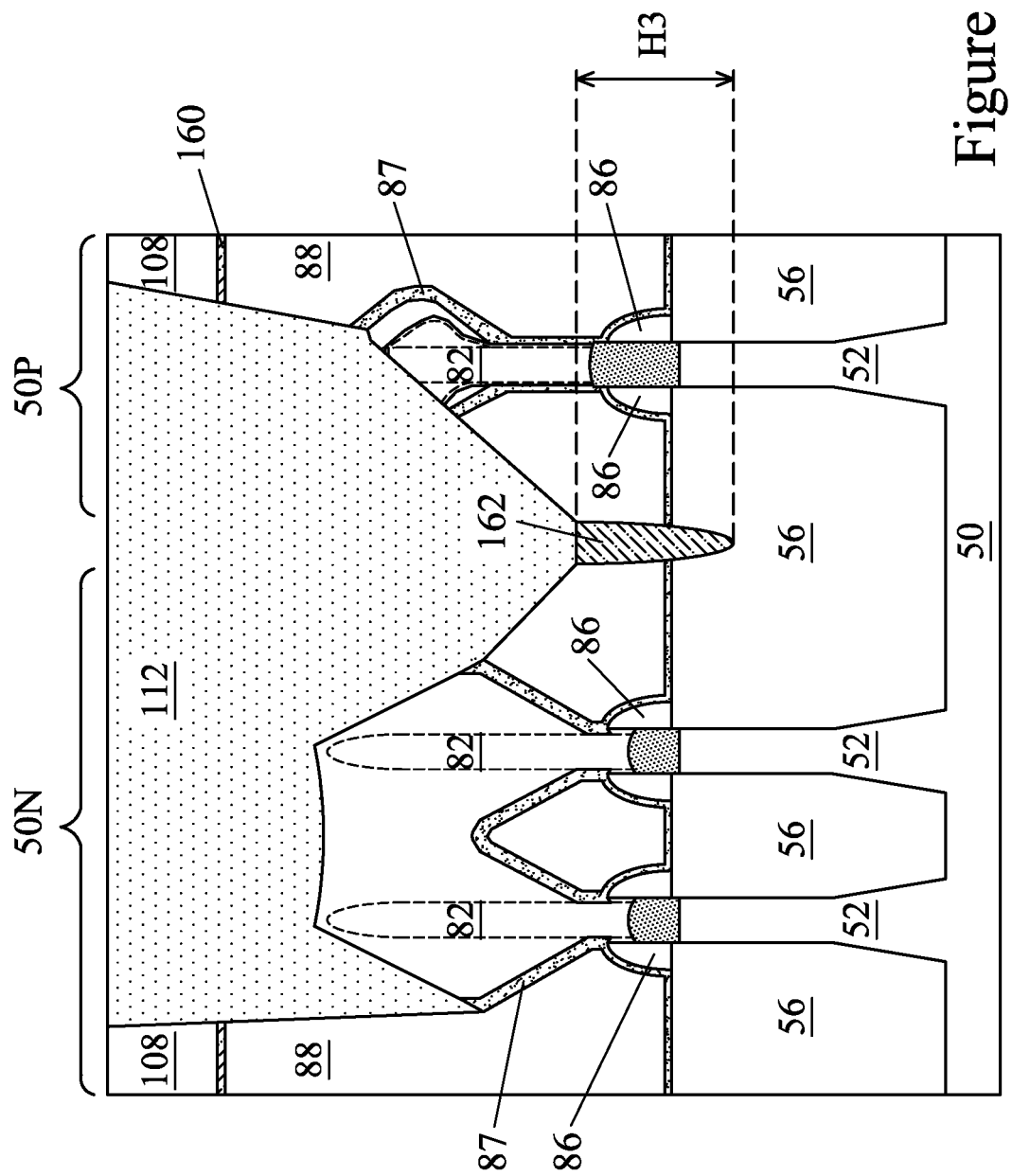

FIGS. 19A-19C illustrate the formation of source/drain contacts 112 in the contact via openings 170 of the first openings 164 and the formation of gate contacts 110 in the contact via openings 170 of the second openings 166. According to some embodiments, once the contact via openings 170 have been formed, the masking layer 163 may be removed, for example, via an ashing process. In other embodiments, the masking layer 163 may be removed during a planarization process (e.g., chemical mechanical planarization (CMP)) of the contacts being formed. However, any suitable process (e.g., CMP) may be used to remove the masking layer 163.

Furthermore, an optional residue clean process may be performed using a relatively weak solution which imparts minimal damage to the surfaces may be utilized. For example, a weak solution such as deionized (DI) water, $SC_1/SC_2$, ozone, or the like may be utilized to remove any undesirable residue from the contact via opening 170 prior to forming the gate contacts 110 and/or the source/drain contacts 112. By utilizing a weak solution, little to no damage occurs to the material of the exposed portions of the epitaxial growth 182 of the source/drain regions 82.

According to some embodiments, an optional liner, such as a diffusion barrier layer, an adhesion layer, or the like, and a conductive material are formed in the contact via openings 170. The optional liner may include titanium, titanium nitride, tantalum, tantalum nitride, or the like. The conductive material may be tungsten, copper, a copper alloy, silver, gold, cobalt, aluminum, nickel, or the like. A planarization process, such as a CMP, may be performed to remove excess material from a surface of the second ILD 108. The remaining portions of the optional liner and the conductive material form the source/drain contacts 112 and gate contacts 110 in the openings. An anneal process may be performed to form a silicide at the interface between the source/drain regions 82 and the source/drain contacts 112. The source/drain contacts 112 are physically and electrically coupled to the exposed portions of the epitaxial growth 182 of the source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

By utilizing the embodiments described herein, less etching damage to the source/drain regions 82 will occur, which damage can increase the series resistance of the device. In particular, by separating the etching selectivity of the CESL 87 and the dielectric isolation region 162, the CESL 87 will remain to protect the source/drain region 82 during the pull-back of the material of the dielectric isolation region 162 (e.g., during the SiN pull-back). With such protection, there is less damage to the source/drain regions 82, and the source/drain regions 82 will retain its dimensions and shape both before and after the pull-back etch.

According to some embodiments, a method, includes: etching an isolation region, the isolation region comprising a first dielectric material and being embedded in a dielectric layer; etching an opening in the dielectric layer and exposing a first portion of a contact etch stop layer through the opening and exposing a second portion of the contact etch stop layer through the opening, the isolation region being disposed between the first and second portions of the contact etch stop layer; removing the first portion of the contact etch stop layer and exposing a first source/drain region through the opening, the contact etch stop layer comprising a second dielectric material, the second dielectric material being different from the first dielectric material; removing the second portion of the contact etch stop layer and exposing a second source/drain region through the opening; and forming a contact in the opening to the first source/drain region and to the second source/drain region. In an embodiment the etching the isolation region includes recessing the isolation region to a depth below the first and second portions of the contact etch stop layer. In an embodiment the etching the opening in the dielectric layer includes, after recessing the isolation region, performing a timed etch of the dielectric layer. In an embodiment the performing the timed etch includes performing a physical etch process with a process gas using a first beam energy for a first time period. In an embodiment the removing the first and second portions of the contact etch stop layer includes, after the first time period, continuing the physical etch process with the process gas using a second beam energy for a second time period, the second beam energy being greater than the first beam energy. In an embodiment the continuing the physical etch process further includes using argon (Ar) as the process gas, the material of the contact etch stop layer being silicon carbon nitride. In an embodiment the removing the first and second portions of the contact etch stop layer includes, after the first time period, performing a wet etch.

In some embodiments, a method, includes: forming a cavity within an interlayer dielectric to expose an isolation structure and to expose a second dielectric material through the cavity, the exposed second dielectric material being above the exposed isolation structure in the cavity and the second dielectric material being different from a dielectric material of the isolation structure; after exposing the isolation structure, removing a first portion and a second portion of the second dielectric material to expose a first source/drain region of a first finFET and a second source/drain region of a second finFET through the cavity; and depositing a conductive material in the cavity to form a contact plug to the first source/drain region and to the second source drain region. In an embodiment the forming the cavity includes performing a timed physical etch of the interlayer dielectric using an inert process gas for the timed physical etch. In an embodiment the isolation structure includes a material with a first set of elements and the second dielectric material includes the first set of elements and at least one additional element. In an embodiment the performing the physical etch includes performing an ion beam etch using a first voltage to form the cavity. In an embodiment the removing a first portion and a second portion of the second dielectric material further includes performing an ion beam etch using a second process voltage to remove the first portion and the second portion of the second dielectric material, the second voltage being greater than the first voltage. In an embodiment the removing a first portion and a second portion of the second dielectric material further includes using a wet etch. In an embodiment performing the wet etch includes using an etchant selective to silicon carbon nitride.

According to some embodiments, a semiconductor device, includes: an interlayer dielectric comprising a first dielectric material; a first source/drain region of a first device embedded in the interlayer dielectric; a second source/drain region of a second device embedded in the interlayer dielectric; an isolation region comprising a second dielectric material embedded in the interlayer dielectric and disposed between the first device and the second device; a contact connected through a first portion of a contact etch stop layer to the first source/drain region and connected through a second portion of the contact etch stop layer to the second source/drain region, the contact etch stop layer includes a third dielectric material being different from the second dielectric material. In an embodiment the second dielectric material includes silicon nitride. In an embodiment the third dielectric material includes silicon carbon nitride. In an embodiment the first device is an NMOS finFET device. In an embodiment the second device is a PMOS finFET device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an interlayer dielectric comprising a first material;
   a first source/drain region of a first device embedded in the interlayer dielectric;
   a second source/drain region of a second device embedded in the interlayer dielectric;
   a fin of the first device, wherein the fin is below the first source/drain region and has a longitudinal axis extending in a first direction;
   an isolation region comprising a second dielectric material embedded in the interlayer dielectric and disposed between the first device and the second device, wherein a first width of an upper portion of the isolation region within the interlayer dielectric is greater than a second width of a lower portion of the isolation region within the interlayer dielectric in a cross-sectional view along a second direction perpendicular to the first direction, wherein first sidewalls of the upper portion having the first width and second sidewalls of the lower portion having the second width are in physical contact with the interlayer dielectric in the cross-sectional view; and
   a contact connected through a first portion of a contact etch stop layer to the first source/drain region and connected through a second portion of the contact etch stop layer to the second source/drain region, the contact etch stop layer comprising a third dielectric material being different from the second dielectric material.

2. The semiconductor device of claim 1, wherein the second dielectric material comprises silicon nitride.

3. The semiconductor device of claim 2, wherein the third dielectric material comprises silicon carbon nitride.

4. The semiconductor device of claim 1, wherein the first device is an NMOS finFET device.

5. The semiconductor device of claim 4, wherein the second device is a PMOS finFET device.

6. The semiconductor device of claim 1, wherein a lowermost surface of the contact contacts an upper surface of the isolation region in the cross-sectional view.

7. The semiconductor device of claim 1, wherein the isolation region has a height in a range between 24 nm and 36 nm.

8. A semiconductor device, comprising:
   a substrate comprising a first fin and a second fin, wherein the first fin has a longitudinal axis extending in a first direction;
   a first source/drain region over the first fin of the substrate;
   a second source/drain region over the second fin of the substrate;
   a first dielectric layer over the first source/drain region and the second source/drain region, the first dielectric layer comprising a first material;
   a conductive feature extending through the first dielectric layer to the first source/drain region and the second source/drain region; and
   a second dielectric layer and a third dielectric layer over the substrate, the second dielectric layer comprising a first portion extending from the conductive feature through the first dielectric layer and a second portion extending from the first portion and partially through the third dielectric layer, the third dielectric layer being interposed between the first dielectric layer and the substrate, the second dielectric layer being a single material formed of a second material, wherein lateral sidewalls of the second dielectric layer are in physical contact with the first dielectric layer in a cross-sectional view along a second direction perpendicular to the first direction.

9. The semiconductor device of claim 8, further comprising a fourth dielectric layer along sidewalls of the first source/drain region and the second source/drain region, wherein the fourth dielectric layer contacts the third dielectric layer.

10. The semiconductor device of claim 9, wherein the second dielectric layer extends into the third dielectric layer a distance in a range between 36 nm and 44 nm.

11. The semiconductor device of claim 9, wherein the fourth dielectric layer and the third dielectric layer are different materials.

12. The semiconductor device of claim 9, wherein the second dielectric layer directly contacts the conductive feature, the first dielectric layer, the third dielectric layer, and the fourth dielectric layer.

13. The semiconductor device of claim 8, wherein the first source/drain region is an n-type region, wherein the second source/drain region is a p-type region.

14. A semiconductor device, comprising:
   a fin comprising a longitudinal axis extending along a first direction;
   a first source/drain region of a first device over the fin;
   a second source/drain region of a second device;
   a contact etch stop layer over the first source/drain region and the second source/drain region, the contact etch stop layer comprising a first dielectric material;
   an interlayer dielectric comprising a second dielectric material around the first source/drain region and around the second source/drain region;
   a trench isolation underlying the interlayer dielectric;
   an isolation region comprising a third dielectric material embedded in the interlayer dielectric and disposed between the first device and the second device, wherein the isolation region has a sidewall continuously extending in an unbroken line segment from a bottom of the isolation region to a topmost surface of the isolation region, the sidewall of the isolation region being in physical contact with the interlayer dielectric, the contact etch stop layer, and the trench isolation in a cross-sectional view along a second direction perpendicular to the first direction, wherein the third dielectric material is different than the first dielectric material, the isolation region having a first width at a first location and a second width less than the first width at a second location lower than the first location, wherein the isolation region contacts the interlayer dielectric at the first location and the second location; and
   a contact extending through the contact etch stop layer, the contact being electrically connected to the first source/drain region and the second source/drain region, a bottommost surface of the contact being below a top surface of the first source/drain region and a top surface of the second source/drain region in the cross-sectional view, the bottommost surface of the contact being above and in physical contact with the topmost surface of the isolation region in the cross-sectional view.

15. The semiconductor device of claim 8, wherein the first portion of the second dielectric layer has a bottom level with an upper surface of the third dielectric layer, wherein a top of the first portion of the second dielectric layer is wider than the bottom of the first portion of the second dielectric layer.

16. The semiconductor device of claim 14, wherein the third dielectric material comprises silicon nitride.

17. The semiconductor device of claim 16, wherein the first dielectric material comprises silicon carbon nitride.

18. The semiconductor device of claim 14, wherein the first device is an NMOS finFET device.

19. The semiconductor device of claim 18, wherein the second device is a PMOS finFET device.

20. The semiconductor device of claim 14, wherein the isolation region extends only partially into the trench isolation.

* * * * *